United States Patent
Bujard et al.

(10) Patent No.: US 9,978,943 B2
(45) Date of Patent: May 22, 2018

(54) ORGANIC FIELD EFFECT TRANSISTOR

(71) Applicant: BASF SE, Ludwigshafen (DE)

(72) Inventors: Patrice Bujard, Courtepin (CH);
Natalia Chebotareva, Hagenthal le Bas (FR); Thomas Weitz, Mannheim (DE); Pascal Hayoz, Hofstetten (CH)

(73) Assignee: BASF SE, Ludwigshafen (DE)

( * ) Notice: Subject to any disclaimer, the term of this patent is extended or adjusted under 35 U.S.C. 154(b) by 0 days. days.

(21) Appl. No.: 14/361,129

(22) PCT Filed: Dec. 3, 2012

(86) PCT No.: PCT/EP2012/074192
§ 371 (c)(1),
(2) Date: May 28, 2014

(87) PCT Pub. No.: WO2013/083507
PCT Pub. Date: Jun. 13, 2013

(65) Prior Publication Data
US 2014/0299871 A1     Oct. 9, 2014

Related U.S. Application Data

(60) Provisional application No. 61/567,652, filed on Dec. 7, 2011.

(30) Foreign Application Priority Data

Dec. 7, 2011  (EP) .................................. 11192317

(51) Int. Cl.
*H01L 29/08* (2006.01)
*H01L 51/00* (2006.01)
*C09B 57/00* (2006.01)
*C09B 69/10* (2006.01)
*C08G 61/12* (2006.01)
(Continued)

(52) U.S. Cl.
CPC ........ *H01L 51/0003* (2013.01); *C08G 61/124* (2013.01); *C08G 61/126* (2013.01); *C08L 65/00* (2013.01); *C09B 57/004* (2013.01); *C09B 69/105* (2013.01); *C09B 69/109* (2013.01); *H01L 51/002* (2013.01); *H01L 51/005* (2013.01); *H01L 51/0035* (2013.01); *H01L 51/0036* (2013.01); *H01L 51/0043* (2013.01); *H01L 51/0068* (2013.01); *H01L 51/0072* (2013.01); *H01L 51/0512* (2013.01); *C08G 2261/1412* (2013.01); *C08G 2261/226* (2013.01); *C08G 2261/228* (2013.01); *C08G 2261/3223* (2013.01); *C08G 2261/344* (2013.01); *C08G 2261/364* (2013.01); *C08G 2261/411* (2013.01); *C08G 2261/91* (2013.01); *C08G 2261/92* (2013.01); *C08G 2261/95* (2013.01); *C08L 2205/02* (2013.01);
(Continued)

(58) Field of Classification Search
CPC ..................................................... C09B 57/004
USPC ............. 257/40, E51.012; 427/331; 528/367
See application file for complete search history.

(56) References Cited

U.S. PATENT DOCUMENTS

| 6,451,459 B1 | 9/2002 | Tieke et al. | |
| 2009/0065766 A1* | 3/2009 | Li | .................................. 257/40 |

(Continued)

FOREIGN PATENT DOCUMENTS

| EP | 2 034 537 A2 | 3/2009 |
| WO | WO 03/052841 A1 | 6/2003 |

(Continued)

OTHER PUBLICATIONS

U.S. Appl. No. 14/385,696, filed Sep. 16, 2014, Welker, et al.
(Continued)

*Primary Examiner* — Shane Fang
(74) *Attorney, Agent, or Firm* — Oblon, McClelland, Maier & Neustadt, L.L.P.

(57) ABSTRACT

The present invention provides an electronic component or device comprising a gate electrode, a source electrode and a drain electrode, wherein said component or device further comprising an organic semiconducting (OSC) material that is provided between the source and drain electrode, wherein the OSC material comprises (a) a polymer represented by formula: (I), and (b) a compound of formula (II). High quality OFETs can be fabricated by the choice of a semiconductor material, which is comprised of a polymer represented by formula I and (b) a compound of formula II.

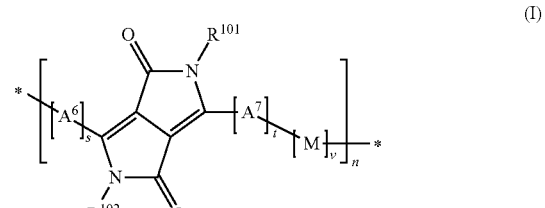

(I)

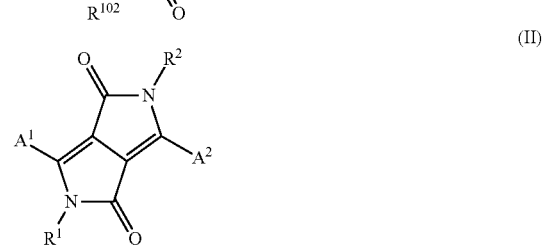

(II)

29 Claims, No Drawings

(51) Int. Cl.
*C08L 65/00* (2006.01)
*H01L 51/05* (2006.01)

(52) U.S. Cl.
CPC ...... *H01L 51/0053* (2013.01); *H01L 51/0545* (2013.01); *H01L 51/0558* (2013.01)

(56) References Cited

U.S. PATENT DOCUMENTS

| | | |
|---|---|---|
| 2009/0065878 A1 | 3/2009 | Li |
| 2011/0004004 A1 | 1/2011 | Hao et al. |
| 2011/0240981 A1 | 10/2011 | Duggeli et al. |
| 2011/0284826 A1 | 11/2011 | Hayoz et al. |
| 2014/0128618 A1 | 5/2014 | Hayoz et al. |

FOREIGN PATENT DOCUMENTS

| | | |
|---|---|---|
| WO | WO 2005/049695 A1 | 6/2005 |
| WO | WO 2005/055248 A2 | 6/2005 |
| WO | WO 2007/082584 A1 | 7/2007 |
| WO | WO 2007/113107 A1 | 10/2007 |
| WO | WO 2008/000664 A1 | 1/2008 |
| WO | WO 2009/047104 A2 | 4/2009 |
| WO | WO 2010/049321 A1 | 5/2010 |
| WO | WO 2010/049323 A1 | 5/2010 |
| WO | WO 2010/108873 A1 | 9/2010 |
| WO | WO 2010/115767 A1 | 10/2010 |
| WO | WO 2010/136352 A1 | 12/2010 |
| WO | WO 2010/136353 A1 | 12/2010 |
| WO | WO 2011/144566 A2 | 11/2011 |
| WO | WO 2011/161078 A1 | 12/2011 |
| WO | WO 2012/041849 A1 | 4/2012 |
| WO | WO 2013/030325 A1 | 3/2013 |

OTHER PUBLICATIONS

U.S. Appl. No. 14/386,123, filed Sep. 18, 2014, Hayoz.
U.S. Appl. No. 14/241,769, filed Feb. 27, 2014, Hayoz, et al.
U.S. Appl. No. 14/362,500, filed Jun. 3, 2014, Hayoz, et al.
International Search Report dated Mar. 19, 2013 in PCT/EP2012/074192.

* cited by examiner

ORGANIC FIELD EFFECT TRANSISTOR

The present invention provides an electronic component or device comprising a gate electrode, a source electrode and a drain electrode, wherein said component or device further comprising an organic semiconducting (OSC) material that is provided between the source and drain electrode, wherein the OSC material comprises (a) a polymer represented by formula I and (b) a compound of formula II. High quality OFETs can be fabricated by the choice of a semiconductor material, which is comprised of a polymer represented by formula Ia I and (b) a compound of formula II.

In recent years, there has been development of organic semiconducting (OSC) materials in order to produce more versatile, lower cost electronic devices. Such materials find application in a wide range of devices or apparatus, including organic field effect transistors (OFETs), organic light emitting diodes (OLEDs), photodetectors, organic photovoltaic (OPV) cells, sensors, memory elements and logic circuits to name just a few. The organic semiconducting materials are typically present in the electronic device in the form of a thin layer, for example less than 1 micron thick.

Improved charge mobility is one goal of new electronic devices. Another goal is improved stability, film uniformity and integrity of the OSC layer as well as stability, uniformity and integrity of the electronic device.

One way potentially to improve OSC layer stability and integrity in devices is to include the OSC component in an organic binder, as disclosed in WO2005/055248A2. Typically one would expect reduction of charge mobility and disruption of the molecular order in the semiconducting layer, due to its dilution in the binder. However, the disclosure of WO2005/055248A2 shows that a formulation comprising an OSC material and a binder still shows a surprisingly high charge carrier mobility, which is comparable to that observed for highly ordered crystalline layers of OSC compounds. Besides, a formulation as taught in WO2005/055248A2 has a better processibility than conventional OSC materials.

WO2007/082584A1 relates to an electronic device, like an organic field effect transistor (OFET), which has a short source to drain channel length and contains an organic semiconducting material comprising an organic semiconducting compound and a semiconducting binder.

Examples of DPP polymers and their synthesis are, for example, described in U.S. Pat. No. 6,451,459B1, WO05/049695, WO2008/000664, WO2010/049321, WO2010/049323, WO2010/108873, WO2010/115767, WO2010/136353, WO2010/136352 and WO2011/144566.

EP2034537A2 is directed to a thin film transistor device comprising a semiconductor layer, the semiconductor layer comprising a compound comprising a chemical structure represented by:

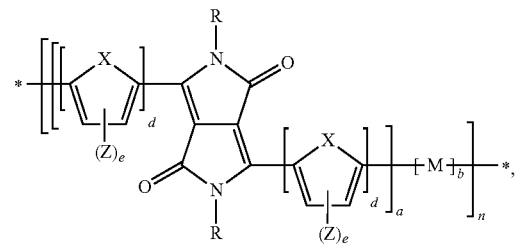

wherein each X is independently selected from S, Se, O, and NR", each R" is independently selected from hydrogen, an optionally substituted hydrocarbon, and a hetero-containing group, each Z is independently one of an optionally substituted hydrocarbon, a hetero-containing group, and a halogen, d is a number which is at least 1, e is a number from zero to 2; a represents a number that is at least 1; b represents a number from 0 to 20; and n represents a number that is at least 1. Among others the following polymers are explicitly disclosed:

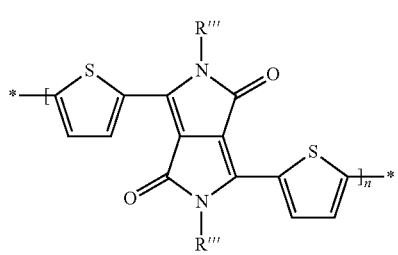

(10)

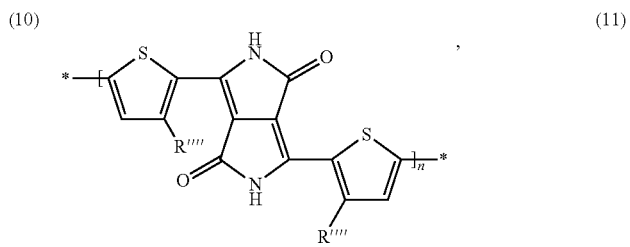

(11)

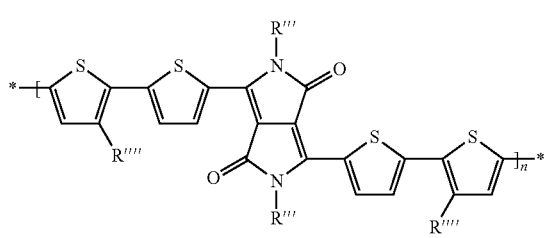

(12)

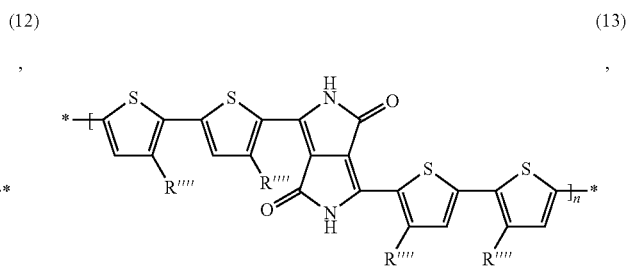

(13)

-continued (48)

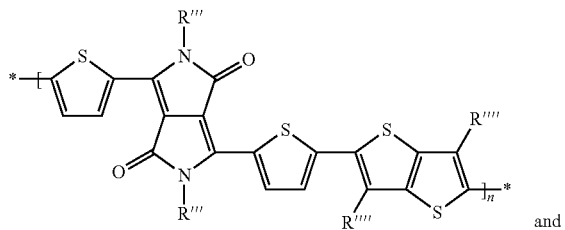

and (49)

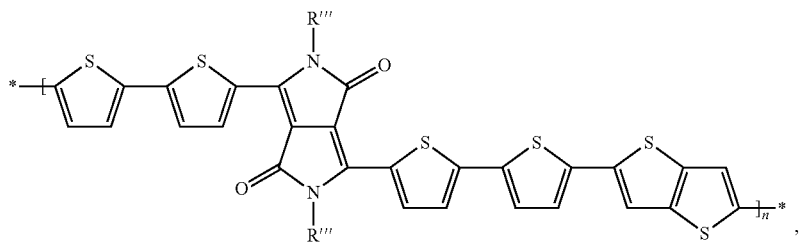

wherein n is the number of repeat units and can be from about 2 to about 5000, R''', R'''' and R''''' can be the same or different substituent, and wherein the substituent is independently selected from the group consisting of an optionally substituted hydrocarbon group and a heteroatom-containing group. EP2034537A2 is silent about explicitly adding a small molecule compound of formula II to the active layer of an OFET, comprising a polymer of formula I.

WO2011161078 (PCT/EP2011/060283) describes a semiconductor device, especially an organic field effect transistor, comprising a layer comprising a polymer comprising repeating units having a diketopyrrolopyrrole skeleton (DPP polymer) and an acceptor compound having an electron affinity in vacuum of 4.6 eV, or more. The doping of the DPP polymer with the acceptor compound leads to an organic field effect transistor with improved hole mobility, current on/off ratio and controllable threshold shift.

PCT/EP2012/066941 describes compositions comprising (a) an oligomer of the formula

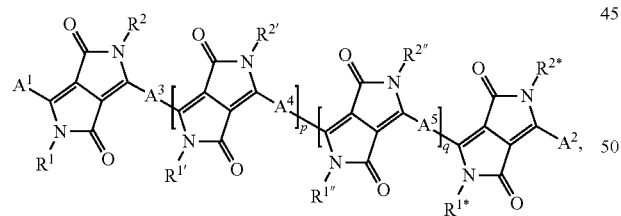

and (b) a polymeric material, such as for example, a diketopyrrolopyrrole (DPP) polymer and the use of the composition as organic semiconductor material in organic devices.

It was an aim of the present invention to reduce or overcome the disadvantages in OSC layers of prior art, to provide improved electronic devices, to provide improved OSC materials and components to be used in such devices, and to provide methods for their manufacture. The device should exhibit improved stability, high film uniformity and high integrity of the OSC layer, the materials should have a high charge mobility and good processibility, and the method should enable easy and time- and cost-effective device production especially at large scale. Other aims of the present invention are immediately evident to the expert from the following detailed description.

The inventors of the present invention have found that further improvements can be made by using specific diketopyrrolopyrrole (DPP) polymers in combination with specific DPP small molecules. That is, high quality OFETs can be fabricated by the choice of a semiconductor material, which is described, for example, in WO2010/049321, and a small molecule, which is, for example, described in WO2009/047104, or WO2012/041849.

Said object has been solved by an electronic component or device comprising a gate electrode, a source electrode and a drain electrode, wherein said component or device further comprising an organic semiconducting (OSC) material that is provided between the source and drain electrode, wherein the OSC material comprises (a) a polymer represented by formula:

(I)

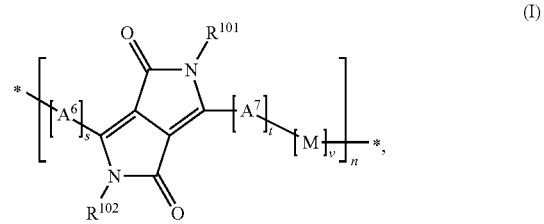

wherein $R^{101}$ and $R^{102}$ may be the same or different and are selected from hydrogen, a $C_1$-$C_{38}$alkyl group, a $C_2$-$C_{38}$alkenyl group, a $C_3$-$C_{38}$alkinyl group, each of which can optionally be interrupted one or more times by —O—, —S— or COO, a $C_7$-$C_{100}$arylalkyl group, which can be substituted one to five times with $C_1$-$C_8$alkyl, $C_1$-$C_8$alkoxy, $CF_3$ and/or F; and a phenyl group which can optionally be substituted one or more times by $C_1$-$C_{25}$alkyl, $C_1$-$C_8$alkoxy, halogen or cyano;

each $A^6$ and $A^7$ is independently selected from

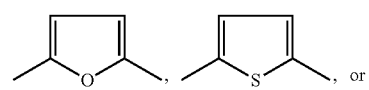

-continued

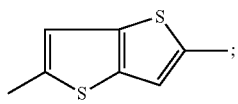

each M is independently selected from

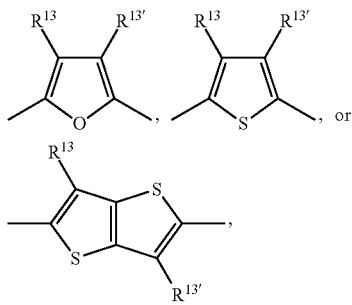

$R^{13}$ and $R^{13'}$ are independently of each other hydrogen, halogen, halogenated $C_1$-$C_{25}$alkyl, especially $CF_3$, cyano, $C_1$-$C_{25}$alkyl, which may optionally be interrupted by one or more oxygen or sulphur atoms; $C_7$-$C_{25}$arylalkyl, or $C_1$-$C_{25}$alkoxy;

s represents a number from 1 to 4; t represents a number from 1 to 4; v represents a number from 0 to 3; and n represents a number that is at least 5, and (b) a compound of formula

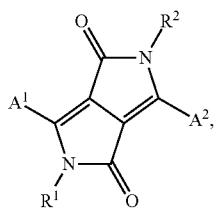

(II)

wherein $A^1$ and $A^2$ are independently of each other a group of formula

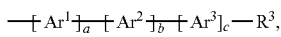

a is 1, or 2; b is 0, or 1; c is 0, or 1;

$R^1$ and $R^2$ may be the same or different and are selected from hydrogen, a $C_1$-$C_{38}$alkyl group, a $C_2$-$C_{38}$alkenyl group, a $C_3$-$C_{38}$alkinyl group, each of which can optionally be interrupted one or more times by —O—, —S— or COO, a $C_7$-$C_{100}$arylalkyl group, which can be substituted one to five times with $C_1$-$C_8$alkyl, $C_1$-$C_8$alkoxy, $CF_3$ and/or F; and a phenyl group which can optionally be substituted one or more times by $C_1$-$C_{25}$alkyl, $C_1$-$C_8$alkoxy, halogen or cyano;

$Ar^1$, $Ar^2$ and $Ar^3$ are independently of each other a bivalent group of formula

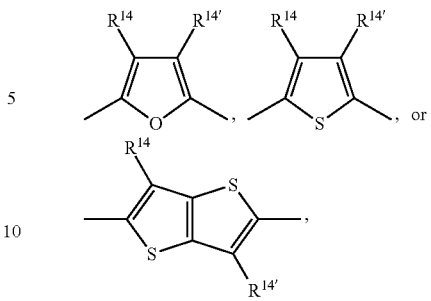

$R^{14}$ and $R^{14'}$ are independently of each other hydrogen, halogen, halogenated $C_1$-$C_{25}$alkyl, especially $CF_3$, cyano, $C_1$-$C_{25}$alkyl, which may optionally be interrupted by one or more oxygen or sulphur atoms; $C_7$-$C_{25}$arylalkyl, or $C_1$-$C_{25}$alkoxy;

$R^3$ is hydrogen, halogen, cyano, $C_1$-$C_{25}$alkyl, halo-$C_1$-$C_{25}$alkyl,

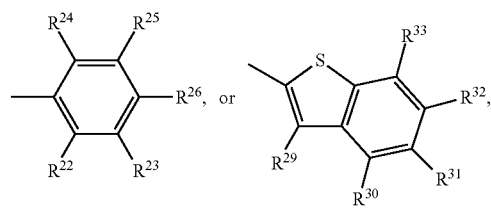

wherein $R^{22}$ to $R^{25}$ and $R^{29}$ to $R^{33}$ represent independently of each other H, halogen, cyano, or $C_1$-$C_{25}$alkyl, and $R^{26}$ is H, halogen, cyano, phenyl, or $C_1$-$C_{25}$alkyl, wherein the compound of formula II is contained in an amount of 0.1 to 99.9% by weight based on the amount of polymer of formula I and compound of formula II.

In addition the present invention is directed to an apparatus comprising the component, or device of the present invention, or the organic layer, especially semiconducting layer of the present invention.

In general, the compound of formula II is contained in an amount of 0.1 to 99.9% by weight, more preferably 1 to 99% by weight, even more preferably 2 to 98% by weight, especially 5 to 95% by weight based on the amount of DPP polymer of formula I and compound of formula II.

Mixing of the respective polymer of formula I (DPP polymer) with the compound of formula II (dopant) to be used according to the present invention may be produced by one or a combination of the following methods: a) sequential deposition of the DPP polymer and dopant with subsequent in-diffusion of the dopant, optionally by heat treatment; b) doping of a DPP polymer layer by a solution of dopant with subsequent evaporation of the solvent, optionally by heat treatment; c) doping of a solution, or dispersion of the DPP polymer by a solution of dopant with subsequent evaporation of the solvent, optionally by heat treatment; and d) doping of a solution of the DPP polymer with a solid compound of formula II to get a dispersion, or solution with subsequent evaporation of the solvent, optionally by heat treatment.

The polymers of this invention preferably have a weight average molecular weight of 10,000 to 1,000,000 and more preferably 10,000 to 100,000 Daltons. Molecular weights are determined according to high-temperature gel permeation chromatography (HT-GPC) using polystyrene standards.

$A^6$ and $A^7$ are independently of each other

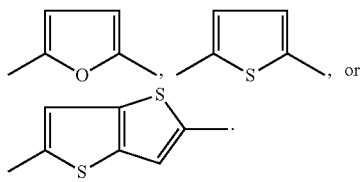

Groups of formula

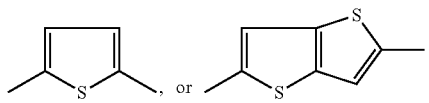

are preferred. A group of formula

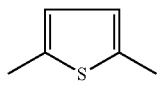

is most preferred.

M is independently selected from

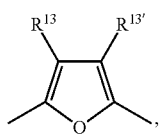

especially

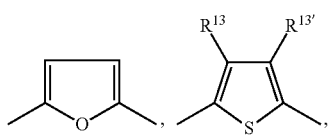

especially

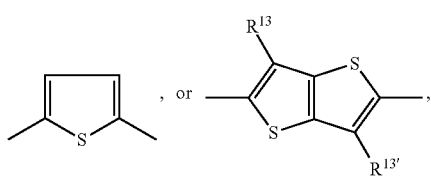

especially

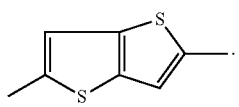

Groups of formula

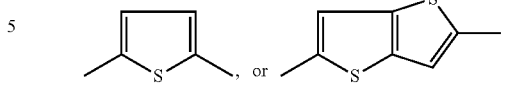

are more preferred. A group of formula

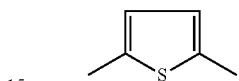

is most preferred.

$R^{13}$ and $R^{13'}$ are independently of each other preferably hydrogen, halogen, halogenated $C_1$-$C_4$alkyl, especially $CF_3$, cyano, $C_1$-$C_4$alkyl or $C_1$-$C_4$alkoxy; even more preferably hydrogen or $C_1$-$C_4$alkyl, most preferred hydrogen.

$R^{101}$ and $R^{102}$ may be different, but are preferably the same. Preferably, $R^{101}$ and $R^{102}$ are a $C_1$-$C_{38}$alkyl group, preferably a $C_4$-$C_{24}$alkyl group, more preferably a $C_8$-$C_{24}$alkyl group, such as, for example, n-dodecyl, tridecyl, tetradecyl, pentadecyl, hexadecyl, 2-ethyl-hexyl, 2-butyl-hexyl, 2-butyl-octyl, 2-hexyldecyl, 2-decyl-tetradecyl, heptadecyl, octadecyl, eicosyl, heneicosyl, docosyl, or tetracosyl. The $C_1$-$C_{38}$alkyl, $C_4$-$C_{24}$alkyl group and $C_8$-$C_{24}$alkyl group can be linear, or branched, but are preferably branched.

Advantageously, the groups $R^{101}$ and $R^{102}$ can be represented by formula

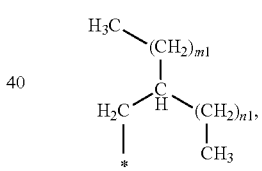

wherein $m1=n1+2$ and $m1+n1 \leq 24$. Chiral side chains, such as $R^{101}$ and $R^{102}$ can either be homochiral, or racemic, which can influence the morphology of the compounds.

Preferably, v is 1, 2, or 3. More preferably, v is 1, or 2.

Preferably the number of heteroaryl groups between two DPP basic units

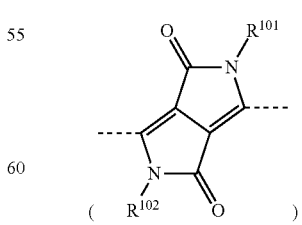

is an integer of 2 to 5, more preferably 3, or 4.

In a preferred embodiment the polymer represented by formula (I) is a polymer of formula

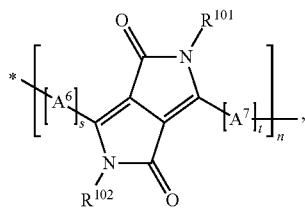

(Ia)

wherein $A^6$ and $A^7$ are independently selected from

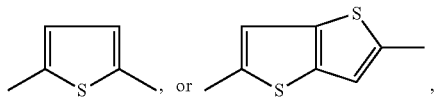

s represents an integer 1, or 2; t represents an integer 1, or 2; and
$R^{101}$ and $R^{102}$ are a $C_1$-$C_{38}$alkyl group, and n is 5 to 1000.

An example of a preferred DPP polymer of formula Ia is shown below:

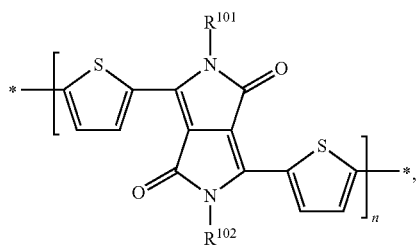

(Ia-1)

wherein $R^{101}$ and $R^{102}$ are a $C_1$-$C_{38}$alkyl group, and n is 5 to 1000.

In another preferred embodiment the polymer represented by formula (I) is a polymer of formula

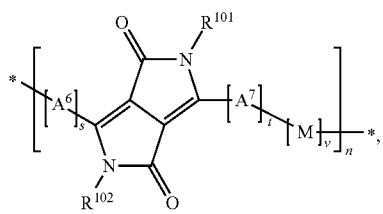

(Ib)

wherein $A^6$ and $A^7$ are independently selected from

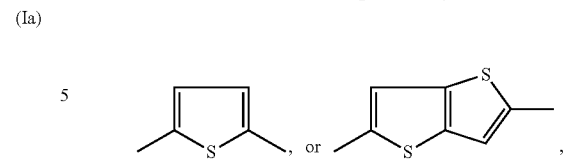

s represents an integer 1, or 2; t represents an integer 1, or 2;

M is selected from

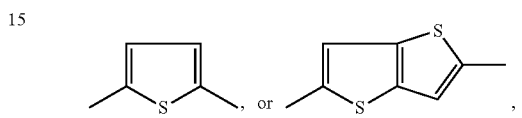

v represents an integer 1, 2, or 3;
$R^{101}$ and $R^{102}$ are a $C_1$-$C_{38}$alkyl group, and n is 5 to 1000.

Examples of preferred DPP polymers of formula Ib are shown below:

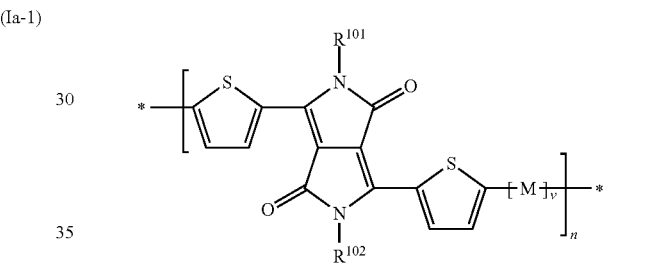

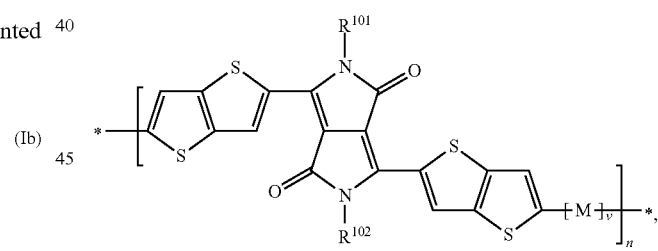

wherein
M, v, n, $R^{101}$ and $R^{102}$ are as defined above.
Polymers represented by formula (Ib-1)

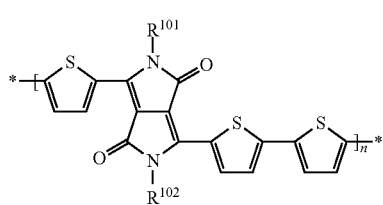

(Ib-2)

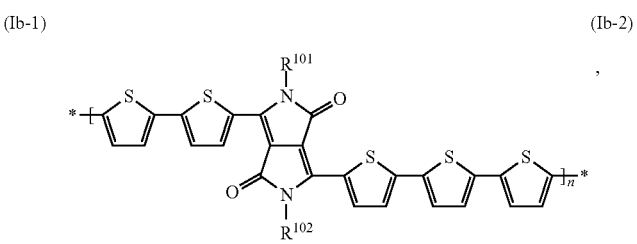

-continued

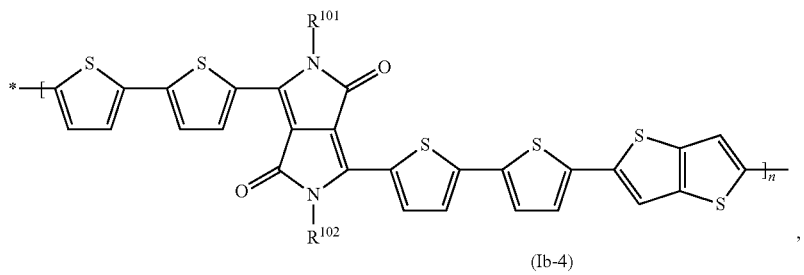
(Ib-3)

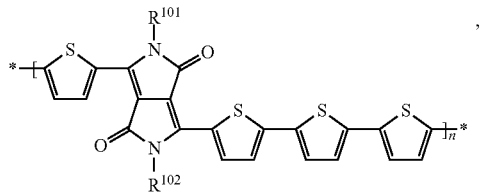
(Ib-4)

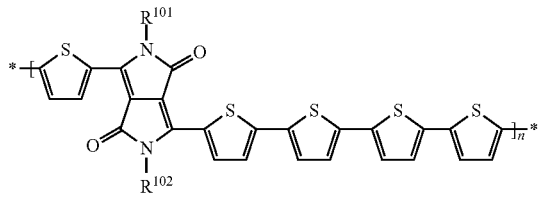
(Ib-5)

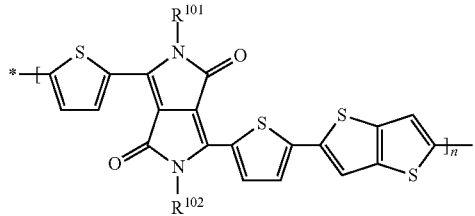
(Ib-6)

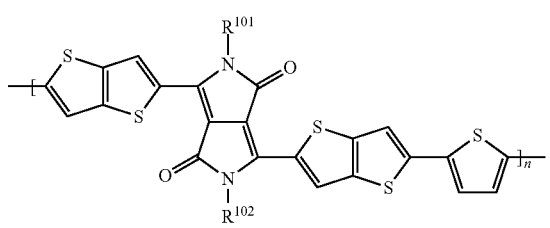
(Ib-7)

and are more preferred, wherein $R^{101}$ and $R^{102}$ are a $C_1$-$C_{38}$alkyl group, and n is 5 to 1000, polymers of formula (Ib-1), (Ib-4), (Ib-6), and (Ib-7) are even more preferred and polymers of formula (Ib-1) are most preferred, such as, for example,

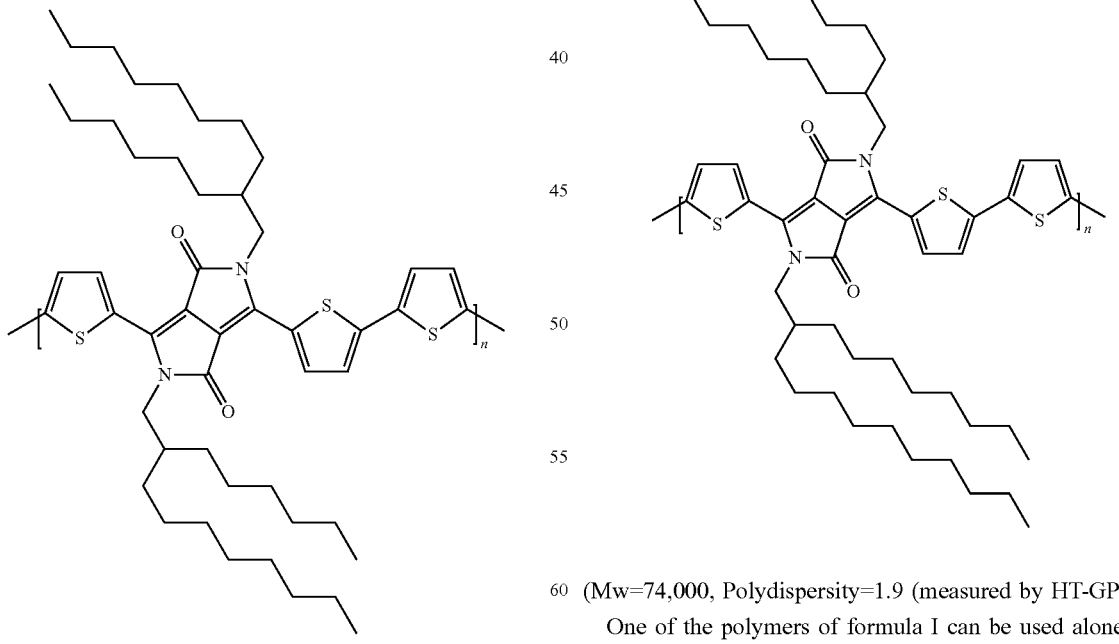

(Example 1 of WO2010/049321; Mw=39,500, Polydispersity=2.2 (measured by HT-GPC)) and (Mw=74,000, Polydispersity=1.9 (measured by HT-GPC)).

One of the polymers of formula I can be used alone, or two or more of these compounds can be used in combination.

One of the compounds of formula II can be used alone, or two or more of these compounds can be used in combination.

The compound of formula II is preferably used in an amount of 5 to 95% by weight, based on the amount of DPP polymer Ib-1 and compound of formula II.

Ar¹, Ar² and Ar³ are independently of each other a bivalent group of formula

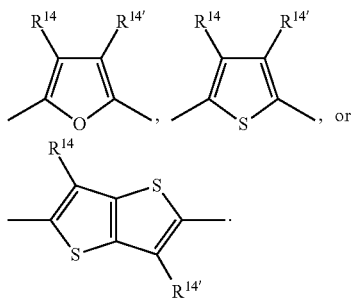

Ar¹ is preferably a group of formula

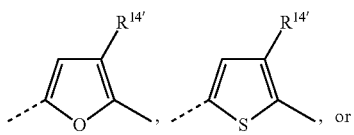

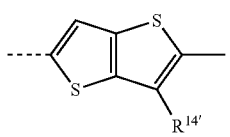

(the dotted line represent the bond to the DPP basic unit).

R¹⁴ and R¹⁴' are independently of each other preferably hydrogen, halogen, halogenated $C_1$-$C_4$alkyl, especially $CF_3$, cyano, $C_1$-$C_4$alkyl or $C_1$-$C_4$alkoxy; even more preferably hydrogen or $C_1$-$C_4$alkyl, most preferred hydrogen.

More preferably Ar¹ is a group of formula

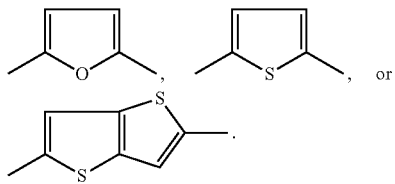

Most preferred Ar¹ is a group of formula

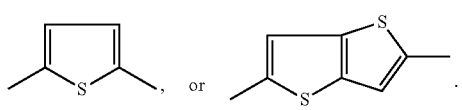

Ar² and Ar³ are preferably a group of formula

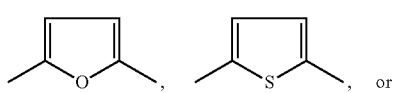

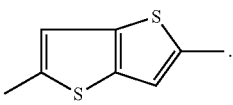

More preferably Ar² and Ar³ are a group of formula

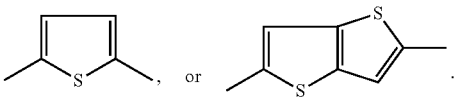

R³ is preferably hydrogen, cyano,

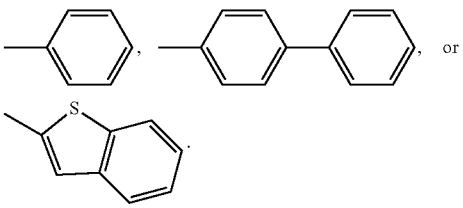

The compound of formula II is preferably a compound of formula

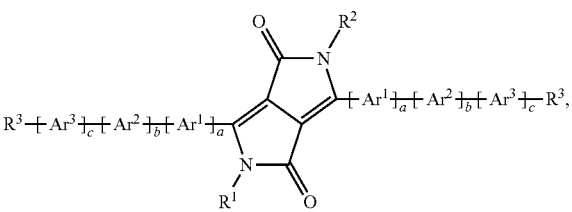

(IIa)

wherein
a is 1, or 2; b is 0, or 1; c is 0, or 1;
R¹ and R² are the same or different and are a $C_1$-$C_{38}$alkyl group,
Ar¹, Ar² and Ar³ are independently of each other a bivalent group of formula

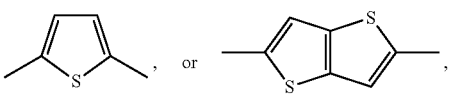

R³ is hydrogen, cyano,

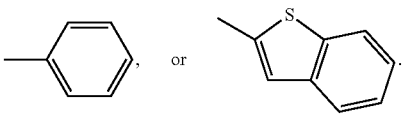

Examples of compounds of formula IIa are shown below:
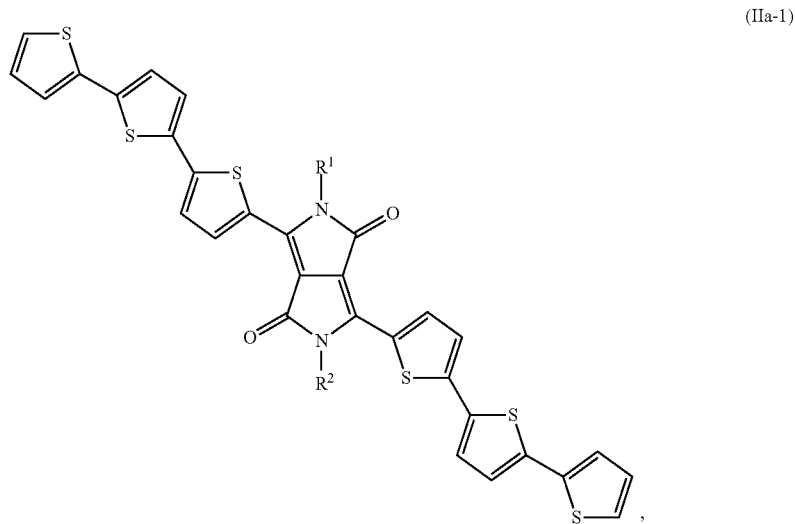
(IIa-1)
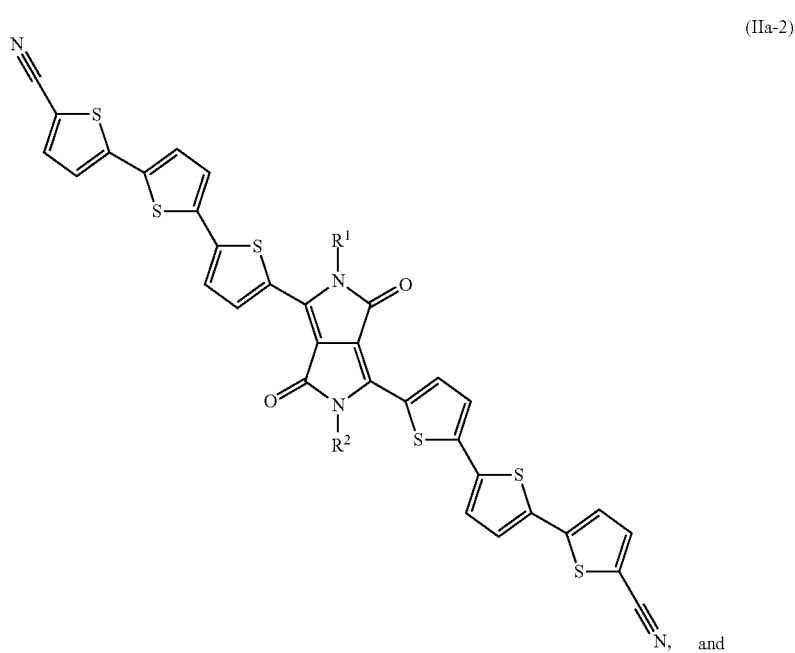
(IIa-2)
and (IIa-3)

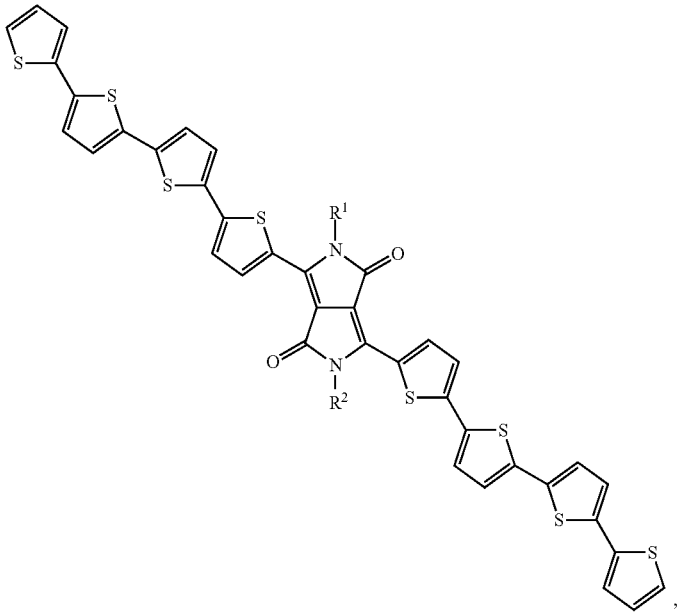

wherein $R^1$ and $R^2$ are the same and are a $C_1$-$C_{38}$alkyl group.

$R^1$ and $R^2$ are a $C_1$-$C_{38}$alkyl group, preferably a $C_4$-$C_{24}$alkyl group, more preferably a $C_8$-$C_{24}$alkyl group, such as, for example, n-dodecyl, tridecyl, tetradecyl, pentadecyl, hexadecyl, 2-ethyl-hexyl, 2-butyl-hexyl, 2-butyl-octyl, 2-hexyldecyl, 2-decyl-tetradecyl, heptadecyl, octadecyl, eicosyl, heneicosyl, docosyl, or tetracosyl. The $C_1$-$C_{38}$alkyl, $C_4$-$C_{24}$alkyl group and $C_8$-$C_{24}$alkyl group can be linear, or branched, but are preferably branched. Preferably $R^1$ and $R^2$ have the same meaning. Advantageously, the groups $R^1$ and $R^2$ can be represented by formula

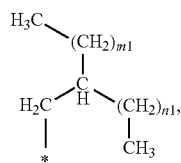

wherein $m1=n1+2$ and $m1+n1 \leq 24$. Chiral side chains, such as $R^1$ and $R^2$ can either be homochiral, or racemic, which can influence the morphology of the compounds.

The at present most preferred compound of formula II is a compound of formula (IIa-1)

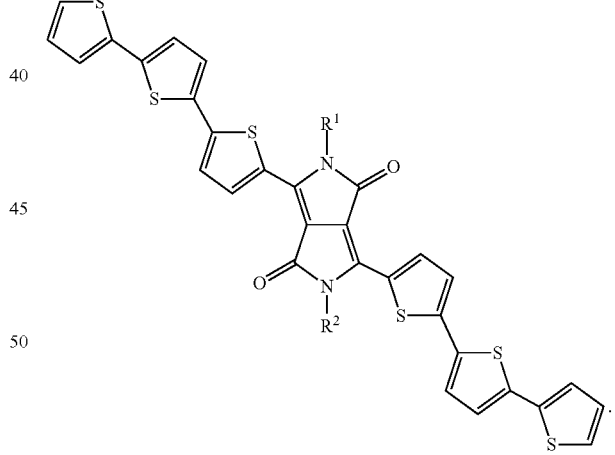

Said derivative is particularly good at doping the DPP polymer, binding to source/drain electrodes, and providing a good solubility in common solvents.

In a particularly preferred embodiment of the present invention the OSC material comprises a compound of formula (IIa-1) and a DPP polymer represented by formula (Ib-1), (Ib-6), or (Ib-7).

In an even more preferred embodiment of the present invention the OSC material comprises a compound of formula (IIa-1) and a DPP polymer represented by formula (Ib-1).

In addition the present invention is directed to an organic layer, especially a semiconducting layer, comprising a polymer of formula I as defined in above and a compound of formula II as defined above; and a formulation, comprising
(a) a polymer of formula I as defined above,
(b) a compound of formula II as defined above, and
(c) a solvent, or solvent mixture.

The formulation can be used for the production of the organic layer, especially a semiconducting layer. The organic layer can be used in an organic semiconductor device.

The semiconducting layer comprising a polymer of formula I and a compound of formula II may additionally comprise at least another material. The other material can be, but is not restricted to another compound of the formula I, a semi-conducting polymer, organic small molecules different from a compound of the formula II, carbon nanotubes, a fullerene derivative, inorganic particles (quantum dots, quantum rods, quantum tripods, $TiO_2$, ZnO etc.), conductive particles (Au, Ag etc).

Halogen is fluorine, chlorine, bromine and iodine, especially fluorine.

$C_1$-$C_{25}$alkyl ($C_1$-$C_{18}$alkyl) is typically linear or branched, where possible. Examples are methyl, ethyl, n-propyl, iso-propyl, n-butyl, sec.-butyl, isobutyl, tert.-butyl, n-pentyl, 2-pentyl, 3-pentyl, 2,2-dimethylpropyl, 1,1,3,3-tetramethyl-pentyl, n-hexyl, 1-methylhexyl, 1,1,3,3,5,5-hexamethyl-hexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetramethylbutyl and 2-ethylhexyl. $C_1$-$C_8$alkyl is typically methyl, ethyl, n-propyl, isopropyl, n-butyl, sec.-butyl, isobutyl, tert.-butyl. A haloalkyl group is an alkyl group, wherein one, or more than one hydrogen atoms are repled by halogen atoms. Examples are $C_1$-$C_4$perfluoroalkyl groups, which may be branched or unbranched, such as, for example, —$CF_3$, —$CF_2CF_3$, —$CF_2CF_2CF_3$, —$CF(CF_3)_2$, —$(CF_2)_3CF_3$, and —$C(CF_3)_3$.

$C_1$-$C_{25}$alkoxy ($C_1$-$C_{18}$alkoxy) groups are straight-chain or branched alkoxy groups, e.g. methoxy, ethoxy, n-propoxy, isopropoxy, n-butoxy, sec-butoxy, tert-butoxy, amyloxy, iso-amyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy. Examples of $C_1$-$C_8$alkoxy are methoxy, ethoxy, n-propoxy, isopropoxy, n-butoxy, sec.-butoxy, isobutoxy, tert.-butoxy, n-pentoxy, 2-pentoxy, 3-pentoxy, 2,2-dimethylpropoxy, n-hexoxy, n-heptoxy, n-octoxy, 1,1,3,3-tetramethylbutoxy and 2-ethylhexoxy, preferably $C_1$-$C_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

$C_2$-$C_{38}$alkenyl groups are straight-chain or branched alkenyl groups and may be unsubstituted or substituted. Examples are allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecenyl, n-dodec-2-enyl or n-octadec-4-enyl.

$C_{2-38}$ alkynyl is straight-chain or branched and may be unsubstituted or substituted. Examples are ethynyl, 1-pro-pyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

$C_7$-$C_{100}$arylalkyl group is typically $C_7$-$C_{25}$aralkyl. The arylalkyl groups can be substituted one to five times with $C_1$-$C_8$alkyl, $C_1$-$C_8$alkoxy, $CF_3$ and/or F. Examples are benzyl, 2-benzyl-2-propyl, β-phenyl-ethyl, α,α-dimethylben-zyl, ω-phenyl-butyl, ω,ω-dimethyl-ω-phenyl-butyl, ω-phe-nyl-dodecyl, ω-phenyl-octadecyl, ω-phenyl-eicosyl or ω-phenyl-docosyl, preferably $C_7$-$C_{18}$aralkyl such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl or ω-phenyl-octadecyl, and particularly preferred $C_7$-$C_{12}$aralkyl such as benzyl, 2-benzyl-2-propyl, β-phenyl-ethyl, α,α-dimethylbenzyl, ω-phenyl-butyl, or ω,ω-dim-ethyl-ω-phenyl-butyl, in which both the aliphatic hydrocar-bon group and aromatic hydrocarbon group may be unsubstituted or substituted. Preferred examples are benzyl, 2-phenylethyl, 3-phenylpropyl, naphthylethyl, naphthylm-ethyl, and cumyl.

Experiments have shown that morphologies ranging from amorphous through to crystalline can be obtained by varia-tion of formulation parameters such as polymer, solvent, concentration, deposition method, etc.

In addition, the present invention is also directed to a formulation, comprising
(a) a polymer of formula I as defined above,
(b) a compound of formula II as defined above, and
(c) a solvent, or solvent mixture.

The formulation and the OSC layer according to the present invention may be prepared by a process which comprises:
(i) first mixing the compound(s) of formula II and polymer (s) of formula I. Preferably the mixing comprises mixing the components together in a solvent or solvent mixture,
(ii) applying the solvent(s) containing the compound(s) of formula II and polymer(s) of formula I to a substrate; and optionally evaporating the solvent(s) to form a solid OSC layer according to the present invention, and
(iii) optionally removing the solid OSC layer from the substrate or the substrate from the solid layer.

In step (i) the solvent may be a single solvent, or the compound(s) of formula II and polymer(s) of formula I may each be dissolved in a separate solvent followed by mixing the two resultant solutions to mix the compounds.

The polymer(s) of formula I may be dissolved together with the compound(s) of formula II in a suitable solvent, and the solution deposited for example by dipping, spraying, painting or printing it on a substrate to form a liquid layer and then removing the solvent to leave a solid layer. It will be appreciated that solvents are chosen which are able to dissolve both the compound(s) of formula II and polymer(s) of formula I, and which upon evaporation from the solution blend give a coherent defect free layer.

Examples of suitable and preferred organic solvents include, without limitation, dichloromethane, trichlorometh-ane, monochlorobenzene, o-dichlorobenzene, 1,2,4-trichlo-robenzene, tetrahydrofuran, anisole, morpholine, toluene, o-xylene, m-xylene, p-xylene, 1,4-dioxane, acetone, methy-lethylketone, 1,2-dichloroethane, 1,1,1-trichloroethane, 1,1, 2,2-tetrachloroethane, ethyl acetate, n-butyl acetate, dimeth-ylformamide, dimethylacetamide, dimethylsulfoxide, tetralin, decalin, indane, mesitylene, 1-methylnaphthalene and/or mixtures thereof.

In accordance with the present invention it has further been found that the level of the solids content in the organic semiconducting layer formulation is also a factor in achieving improved mobility values for electronic devices such as OFETs. The solids content of the formulation is commonly expressed as follows:

$$\text{Solids content}(\%) = ((a+b)/(a+b+c)) \cdot 100,$$

wherein
a=mass of compound of formula II, b=mass of polymer of formula I and c=mass of solvent.

The solids content of the formulation is preferably 0.1 to 10% by weight, more preferably 0.5 to 5% by weight. Even more preferably 0.5 to 2% by weight and most preferably 0.5 to 1% by weight.

It is desirable to generate small structures in modern microelectronics to reduce cost (more devices/unit area), and power consumption. Patterning of the layer of the invention may be carried out by photolithography, electron beam lithography or laser patterning.

Liquid coating of organic electronic devices such as field effect transistors is more desirable than vacuum deposition techniques. The formulations of the present invention enable the use of a number of liquid coating techniques. The organic semiconductor layer may be incorporated into the final device structure by, for example, and without limitation, dip coating, spin coating, ink jet printing, letter-press printing, screen printing, doctor blade coating, roller printing, reverse-roller printing, offset lithography printing, flexographic printing, web printing, spray coating, slot-die coating, brush coating or pad printing.

Selected formulations of the present invention may be applied to prefabricated device substrates by ink jet printing or microdispensing. In order to be applied by ink jet printing or microdispensing, the mixture of the compound of formula II and the polymer of formula I should be first dissolved in a suitable solvent. Solvents must fulfil the requirements stated above and must not have any detrimental effect on the chosen print head.

Additionally, solvents should have boiling points >100° C. in order to prevent operability problems caused by the solution drying out inside the print head. Suitable solvents include substituted and non-substituted xylene derivatives, di-$C_1$-$C_2$-alkyl formamide, substituted and non-substituted anisoles and other phenol-ether derivatives, substituted naphthalenes, substituted heterocycles such as substituted pyridines, pyrazines, pyrimidines, pyrrolidinones, substituted and non-substituted N,N-di-$C_1$-$C_2$-alkylanilines and other fluorinated or chlorinated aromatics. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point >100° C. Such solvent(s) also enhance film formation in the layer deposited and reduce defects in the layer.

The OSC formulation according to the present invention can additionally comprise one or more further components like for example surface-active compounds, lubricating agents, wetting agents, dispersing agents, hydrophobing agents, adhesive agents, flow improvers, defoaming agents, deaerators, diluents, reactive or non-reactive diluents, auxiliaries, colourants, dyes, pigments or nanoparticles, furthermore, especially in case crosslinkable binders are used, catalysts, sensitizers, stabilizers, inhibitors, chain-transfer agents or co-reacting monomers.

The invention further relates to an electronic device comprising the OSC layer. The electronic device may include, without limitation, an organic field effect transistor (OFET), organic light emitting diode (OLED), photodetector, diode, resistor, sensor, logic circuit, memory element, capacitor or photovoltaic (PV) cell, or a combination thereof. For example, the active semiconductor channel between the drain and source in an OFET may comprise the layer of the invention. As another example, a charge (hole or electron) injection or transport layer in an OLED device may comprise the layer of the invention. The OSC formulations according to the present invention and OSC layers formed therefrom have particular utility in OFETs especially in relation to the preferred embodiments described herein.

The electronic component, or device according to the present invention is preferably an organic field effect transistor (OFET). The organic field effect transistor comprises a gate electrode, a gate insulator layer, a semiconductor layer, a source electrode, and a drain electrode, the semiconductor layer represents the layer comprising the DPP polymer of formula I and the compound of formula II.

The organic semi-conducting material (DPP polymer of formula I and the compound of formula II) is solution processable, i.e. it may be deposited by, for example, inkjet printing.

An OFET device according to the present invention preferably comprises:
  a source electrode,
  a drain electrode,
  a gate electrode,
  a semiconducting layer,
  one or more gate insulator layers, and
  optionally a substrate, wherein the semiconductor layer comprises the DPP polymer of formula I and the compound of formula II.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably the OFET comprises an insulator having a first side and a second side, a gate electrode located on the first side of the insulator, a layer comprising the DPP polymer of formula I and the compound of formula II located on the second side of the insulator, and a drain electrode and a source electrode located on the OSC layer.

The OFET device can be a top gate device or a bottom gate device.

Suitable structures and manufacturing methods of an OFET device are known to the person skilled in the art and are described in the literature, for example in WO03/052841.

Typically the semiconducting layer of the present invention is at most 1 micron (=1 μm) thick, although it may be thicker if required. For various electronic device applications, the thickness may also be less than about 1 micron. For example, for use in an OFET the layer thickness may typically be 100 nm or less. The exact thickness of the layer will depend, for example, upon the requirements of the electronic device in which the layer is used.

The insulator layer (dielectric layer) generally can be an inorganic material film or an organic polymer film. Illustrative examples of inorganic materials suitable as the gate dielectric layer include silicon oxide, silicon nitride, aluminum oxide, barium titanate, barium zirconium titanate and the like. Illustrative examples of organic polymers for the gate dielectric layer include polyesters, polycarbonates, poly(vinyl phenol), polyimides, polystyrene, poly(methacrylate)s, poly(acrylate)s, epoxy resin, photosensitive resists as described in WO07/113107 and the like. In the exemplary embodiment, a thermally grown silicon oxide ($SiO_2$) may be used as the dielectric layer. Combinations of organic and inorganic insulator layers may also be used.

The thickness of the dielectric layer is, for example from about 10 nanometers to about 2000 nanometers depending on the dielectric constant of the dielectric material used. A representative thickness of the dielectric layer is from about 100 nanometers to about 500 nanometers. The dielectric layer may have a conductivity that is for example less than about $10^{-12}$ S/cm.

The gate insulator layer may comprise, for example, a fluoropolymer, like e.g. the commercially available Cytop 809M®, or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont), or Fluoropel® (from Cytonix) or the perfluorosolvent FC 43® (Acros, No. 12377).

In order to form the organic active layer using the DPP polymer of formula I and the compound of formula II, a composition for the organic active layer including chloroform or chlorobenzene may be used. Examples of the solvent used in the composition for the organic active layer may include chloroform, chlorobenzene, dichlorobenzene, trichlorobenzene, toluene, xylene, methylnaphthalene, mesithylene, indane, tetraline, decaline, or mixtures thereof.

Examples of the process of forming the organic active layer may include, but may not be limited to, screen printing, printing, spin coating, slot-die coating, dipping or ink jetting.

As such, in the gate insulating layer (gate dielectric) included in the OFET any insulator having a high dielectric constant may be used as long as it is typically known in the art. Specific examples thereof may include, but may not be limited to, a ferroelectric insulator, including $Ba_{0.33}Sr_{0.66}TiO_3$ (BST: Barium Strontium Titanate), $Al_2O_3$, $Ta_2O_5$, $La_2O_5$, $Y_2O_5$, or $TiO_2$, an inorganic insulator, including $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$(BZT), $BaTiO_3$, $SrTiO_3$, $Bi_4Ti_3O_{12}$, $SiO_2$, $SiN_x$, or AlON, or an organic insulator, including polyimide, benzocyclobutane (BCB), parylene, polyvinylalcohol, polyvinylphenol, polyvinylpyrrolidine (PVP), acrylates such as polymethylmethacrylate (PMMA) and benzocyclobutanes (BCBs). The insulating layer may be formed from a blend of materials or comprise a multi-layered structure. The dielectric material may be deposited by thermal evaporation, vacuum processing or lamination techniques as are known in the art. Alternatively, the dielectric material may be deposited from solution using, for example, spin coating or ink jet printing techniques and other solution deposition techniques.

If the dielectric material is deposited from solution onto the organic semiconductor, it should not result in dissolution of the organic semiconductor. Likewise, the dielectric material should not be dissolved if the organic semiconductor is deposited onto it from solution. Techniques to avoid such dissolution include: use of orthogonal solvents, that is use of a solvent for deposition of the uppermost layer that does not dissolve the underlying layer, and crosslinking of the underlying layer. The thickness of the insulating layer is preferably less than 2 micrometers, more preferably less than 500 nm.

In the gate electrode and the source/drain electrodes included in the OFET of the present invention, a typical metal may be used, specific examples thereof include, but are not limited to, platinum (Pt), palladium (Pd), gold (Au), silver (Ag), copper (Cu), aluminum (Al), nickel (Ni). Alloys and oxides, such as molybdenum trioxide and indium tin oxide (ITO), may also be used. Preferably, the material of at least one of the gate, source and drain electrodes is selected from the group Cu, Ag, Au or alloys thereof. The source and drain electrodes may be deposited by thermal evaporation and patterned using standard photolithography and lift off techniques as are known in the art.

The substrate may be rigid or flexible. Rigid substrates may be selected from glass or silicon and flexible substrates may comprise thin glass or plastics such as poly(ethylene terephthalate) (PET), polyethylenenaphthalate (PEN), polycarbonate, polycarbonate, polyvinylalcohol, polyacrylate, polyimide, polynorbornene, and polyethersulfone (PES).

Alternatively, conductive polymers may be deposited as the source and drain electrodes. An example of such a conductive polymer is poly(ethylene dioxythiophene) (PEDOT) although other conductive polymers are known in the art. Such conductive polymers may be deposited from solution using, for example, spin coating or ink jet printing techniques and other solution deposition techniques. The source and drain electrodes are preferably formed from the same material for ease of manufacture. However, it will be appreciated that the source and drain electrodes may be formed of different materials for optimisation of charge injection and extraction, respectively.

Typical thicknesses of source and drain electrodes are about, for example, from about 10, especially 40; nanometers to about 1 micrometer with the more specific thickness being about 20, especially 100; to about 400 nanometers.

The length of the channel defined between the source and drain electrodes may be up to 500 microns, but preferably the length is less than 200 microns, more preferably less than 100 microns, most preferably less than 20 microns.

Other layers may be included in the device architecture. For example, a self assembled monolayer (SAM) may be deposited on the gate, source or drain electrodes, substrate, insulating layer and organic semiconductor material to promote crystallity, reduce contact resistance, repair surface characteristics and promote adhesion where required. Exemplary materials for such a monolayer include chloro-, or alkoxy-silanes, or phosphonic acids with long alkyl chains, such as, for example, octadecyltrichlorosilane.

The method of manufacturing the organic thin film transistor may comprise: depositing a source and drain electrode; forming a semiconductive layer on the source and drain electrodes, the semiconductive layer comprising the DPP polymer and the DPP compound in a channel region between the source and drain electrode. The organic semiconductive material is preferably deposited from solution. Preferred solution deposition techniques include spin coating and ink jet printing. Other solution deposition techniques include dip-coating, roll printing and screen printing.

A bottom-gate OFET device may be formed using the method illustrated below.

1. Gate deposition and patterning (e.g. patterning of an ITO-coated substrate).
2. Dielectric deposition and patterning (e.g. cross-linkable, photopatternable dielectrics).
3. Source-drain material deposition and patterning (e.g. silver, photolithography).
4. Source-drain surface treatment. The surface treatment groups could be applied by dipping the substrate into a solution of the self-assembled material, or applying by spin coating from a dilute solution. Excess (un-attached) material can be removed by washing.
5. Deposition of the organic semiconductive material (e.g. by ink jet printing).

This technique is also compatible with top-gate devices. In this case, the source-drain layer is deposited and patterned first. The surface treatment is then applied to the source-drain layer prior to organic semiconductive material, gate dielectric and gate deposition.

OFETs have a wide range of possible applications. One such application is to drive pixels in an optical device (apparatus), preferably an organic optical device. Examples of such optical devices include photoresponsive devices, in particular photodetectors, and light-emissive devices, in particular organic light emitting devices. High mobility OTFTs are particularly suited as backplanes for use with active matrix organic light emitting devices, e.g. for use in display applications.

The following examples are included for illustrative purposes only and do not limit the scope of the claims. Unless otherwise stated, all parts and percentages are by weight.

a) 3.48 g of the compound [1044589-80-2] are dissolved in 200 ml of chloroform and the solution is cooled to −10° C. Then of one drop of perchlorid acid (70% in water) is added and then 0.82 g of N-bromo-succinimid are added portionwise. The reaction mixture is stirred for 2 hours at −10° C. and then poured on ice-water. The product is extracted with chloroform. The organic phase is dried over $MgSO_4$, filtered and the solvent is removed. The compound of formula 1 is obtained after chromatography over silica gel. $^1$H-NMR data (ppm, $CDCl_3$): 8.87 1H d, 8.59 1H d, 7.63 1H d, 7.26 1H dxd, 7.21 1H d, 4.00 2H d, 3.93 2H d, 1.89 2H m, 1.38-1.14 48H m, 0.86 6H t, 0.84 6H t.

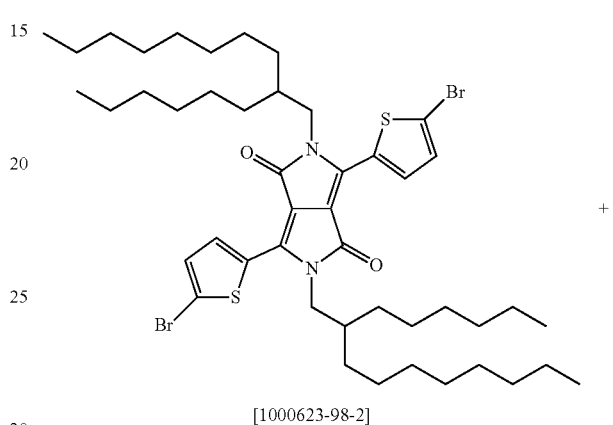

[1000623-98-2]

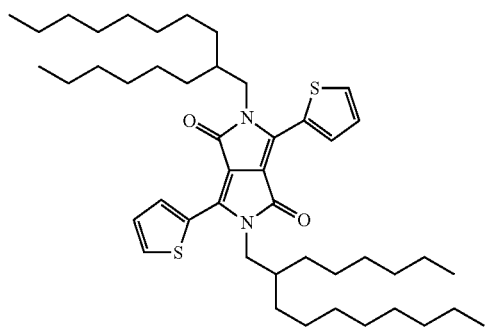

[1044598-80-2]
Example 1

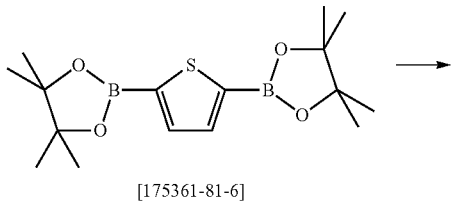

[175361-81-6]

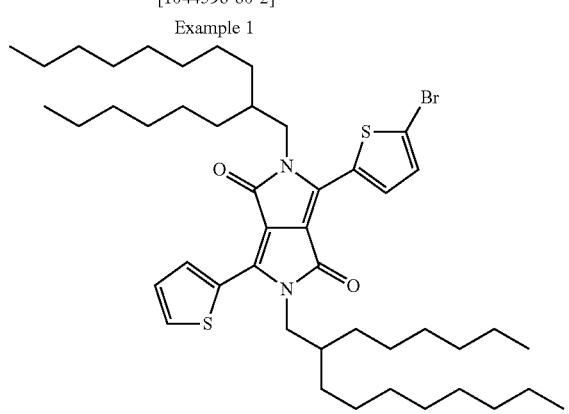

1
Examples

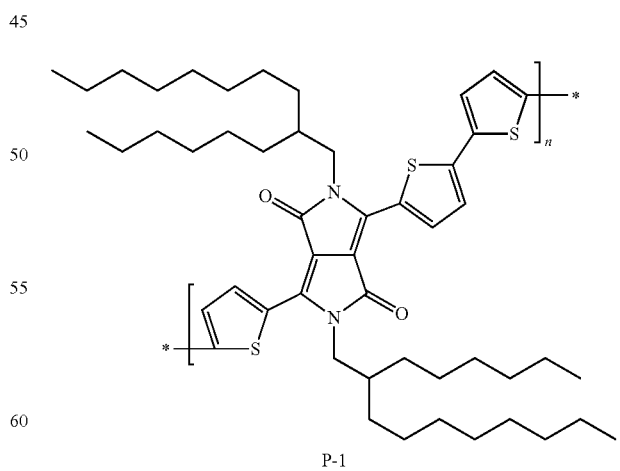

P-1 b) 19.96 g of the dibromo compound [1000623-98-2], 1.822 g of the compound 1, 7.394 g of the diboronicacidester [175361-81-6], 0.027 g of palladium(II)acetate and 0.133 g of the phosphine ligand,

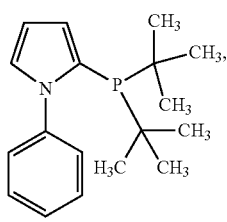 [SMILES: CC(C)(C)P(c1cccn1-c1ccccc1)C(C)(C)C]

[672937-61-0] are dissolved under argon in 240 ml of degassed tetrahydrofurane in a reactor at reflux. Then 5.530 g of LiOH monohydrate [1310-66-3] are added and the reaction mixture is refluxed further. The reaction mixture is then precipitated, filtered and washed with water and methanol. The filter cake is then dissolved in chloroform and refluxed together with a 3% NaCN solution in water for half an hour. The phases are separated and the chloroform solution is washed three times with water and the product is then precipitated out of the chloroform solution with acetone to give the polymer of the formula P-1. The polymer is characterized by high-temperature GPC and the molecular weight is 23050 with a Mw/Mn ratio of 1.7.

EXAMPLE 2

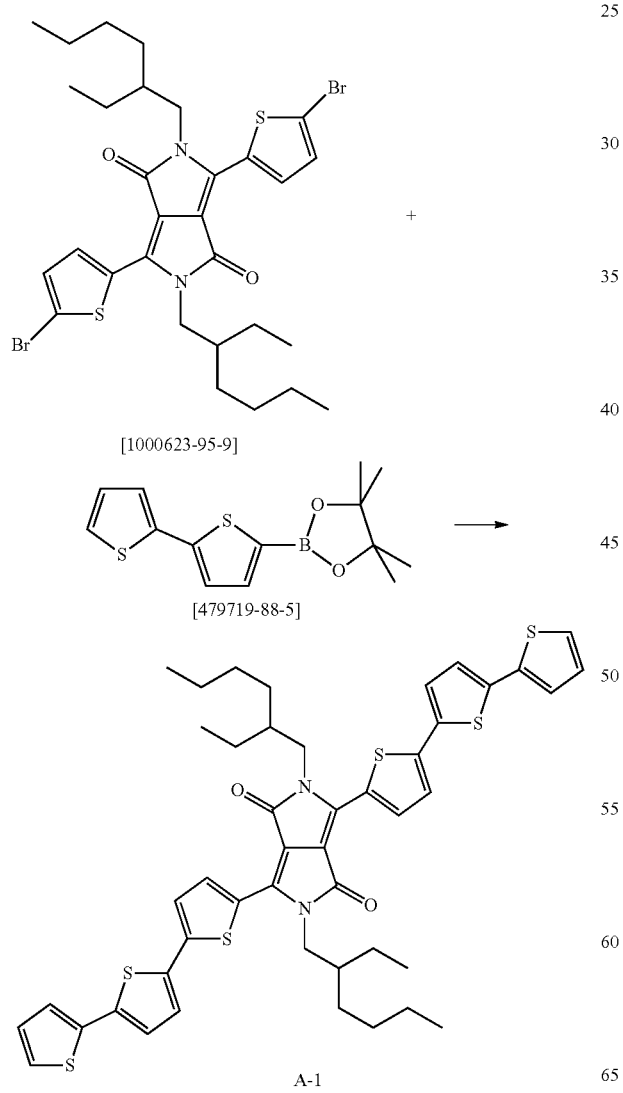

A-1

1.0042 g of the dibromo compound [1000623-95-9], 1.1079 g of the boronicacidester [479719-88-5], 0.0133 g of palladium(II)acetate and 0.0710 g of the phosphine ligand [672937-61-0] are dissolved under argon in 40 ml of degassed tetrahydrofurane in a reactor at reflux. Then 0.3700 g of LiOH monohydrate[1310-66-3] are added and the reaction mixture is refluxed for 20 hours. The reaction mixture is then poured on ice-water, filtered and washed with water. The dried filter cake is then purified by column chromatography over silica gel to give the compound of the formula A-1. $^1$H-NMR data (ppm, CDCl$_3$): 8.95 2H d, 7.27 4H d, 7.21 4H dxd, 7.11 4H d, 7.04 4H d, 4.05 4H m, 1.95 2H m, 1.48-1.25 16H m, 0.95 6H t, 0.92 6H t.

APPLICATION EXAMPLE 1 a) Substrate Preparation:

A flexible foil of polyethylene terephthalate (PET) (Mitsubishi Hostaphan GN) is coated with a 30 nm thick layer of gold. Interdigited electrodes are made by photolithography on the gold layer. The channel width L is 10 microns and its length W is 10000 microns leading to a W/L ratio of 1000. The substrate is then carefully cleaned with acetone and isopropanol in order to remove any remaining trace of photoresist employed to make the electrodes.

b) Solution Preparation:

Solution A: 0.75% of polymer

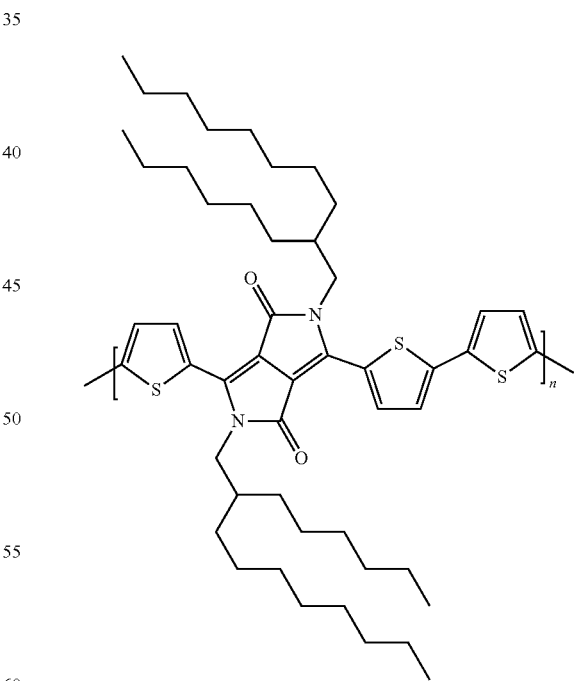

(P-1, M$_W$: 23050) are dissolved in toluene during 4 hours at 80° C.

Solution B: 0.75% of compound

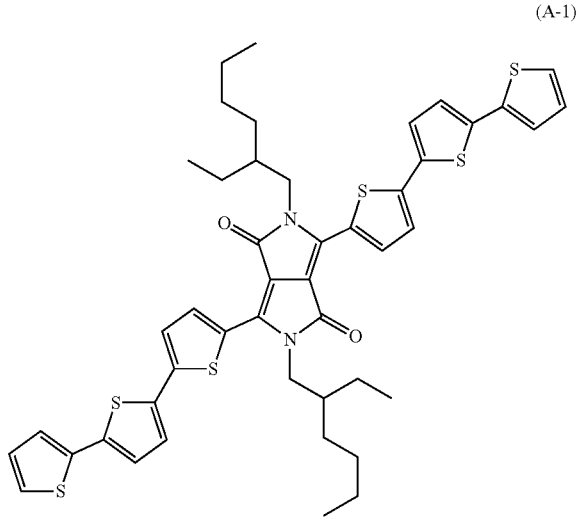 [SMILES: CCCCC(CC)CN1C(=O)C2=C(c3ccc(-c4ccc(-c5cccs5)s4)s3)N(CC(CC)CCCC)C(=O)C2=C1c1ccc(-c2ccc(-c3cccs3)s2)s1]

(A-1)

are dissolved in a mixture of toluene and chloroform (95:5) during 2 hours at 50° C.

5% by weight of solution B are mixed with 95% by weight of solution A (=semiconductor solution).

c) OFET Preparation (Top Gate Bottom Contact)

c1) Organic Semiconductor Layer

The semiconductor solution is spin coated in air (clean room) on the cleaned flexible substrate. Then the film is dried 30 seconds on a hot plate at 90° C. in air. The spin conditions (rpm 1500 during 15 seconds) are such that the thickness of the semiconductor film after drying is 50+/−5 nm (thickness measured with a Dektak 6M (from Veeco).

c2) Dielectric Layer

The dielectric solution is a 4% butylacetate/ethyllactate (60/40) solution of polymethyl methacrylate (PMMA) 950K (1004084 from Allresist). The dielectric solution is applied on the dried semiconductor layer by spin coating (rpm=1800 during 30 seconds) giving a thickness of 500 nm+/−10 nm (after drying). The dielectric layer is dried 2 minutes at 90° C. in air. The capacitance of the dielectric film is 7+/−0.2 nF/cm².

c3) Gate

The gate electrode is made by thermal evaporation of 50 nm gold on the dielectric. The evaporation is made under high vacuum (<10⁻⁵ Torr).

d) OFET Measurements

The saturation transfer curves of OFET were measured with a Keithley 2612A source meter. The observed hole mobility (average of 6 OFET's calculated from saturation transfer curves with drain voltage=−20 V) at a gate voltage of −15 V is 0.45+/−0.03 cm²/sec*V and a subthreshold swing of less then 0.5 V/DEC. The subthreshold swing (the lower the better) is an indication of the concentration of the trapping state at the dielectric/semiconductor interface. At best, at room temperature, it can be 60 mV/dec.

COMPARATIVE APPLICATION EXAMPLE 1

Application Example 1 is repeated with the exception that the semiconductor solution does not contain compound A-1.

The observed hole mobility (average of 6 OFET's calculated from saturation transfer curves with drain voltage=−20 V) at a gate voltage of −15 V is 0.23+/−0.04 cm²/sec*V and a subthreshold swing of less then 1 V/DEC.

The OFET of Application Example 1, where the semiconductor layer consists of polymer P-1 and compound A-1, shows superior reproduceability, hole mobility and subthreshold swing in comparison with the OFET of Comparative Application Example 1, where the semiconductor layer consists only of polymer P-1.

The invention claimed is:

1. An electronic component or an electronic device comprising:
   a gate electrode;
   a source electrode; and
   a drain electrode;
   wherein the component or the device further comprises an organic semiconducting (OSC) material that is provided between the source electrode and the drain electrode, wherein the OSC material comprises
   (a) a polymer of formula Ib:

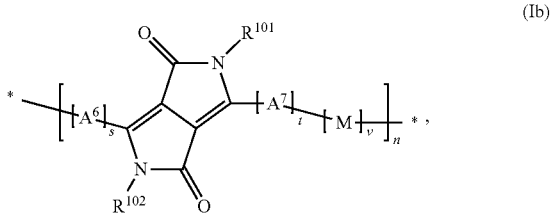

(Ib)

wherein at least one of $A^6$ and $A^7$ is

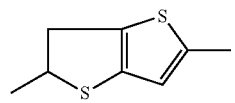

and the other of $A^6$ and $A^7$ is

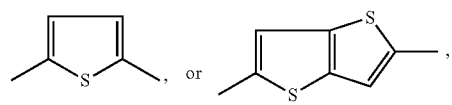

s is an integer 1, or 2; t is an integer 1, or 2;
M is

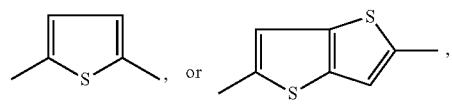

v is an integer 1, 2, or 3;
$R^{101}$ and $R^{102}$ are a $C_1$-$C_{38}$alkyl group and n is 5 to 1000, wherein the polymer of formula Ib is not a polymer of formula Ib-3:

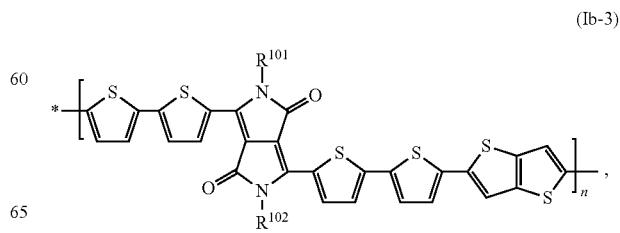

(Ib-3)

and
(b) a compound of formula IIa:

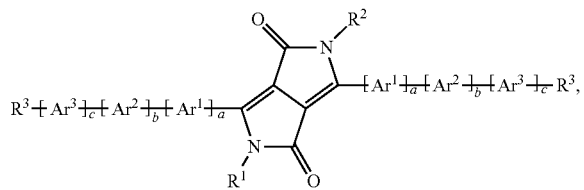
(IIa)

wherein
a is 1, or 2; b is 0, or 1; c is 0, or 1;
$R^1$ and $R^2$ are the same or different and are a $C_1$-$C_{38}$alkyl group,
$Ar^1$, $Ar^2$ and $Ar^3$ are each independently a bivalent group of formula

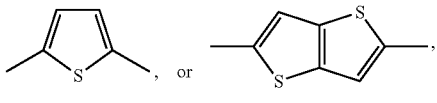, or $R^3$ is hydrogen, cyano,

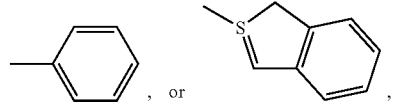, or wherein the compound of formula IIa is present in said OSC material in an amount of 0.1 to 99.9% by weight based on the amount of the polymer of formula Ib and the compound of formula IIa.

2. The component or the device of claim 1, wherein the compound of formula IIa is a compound of formula

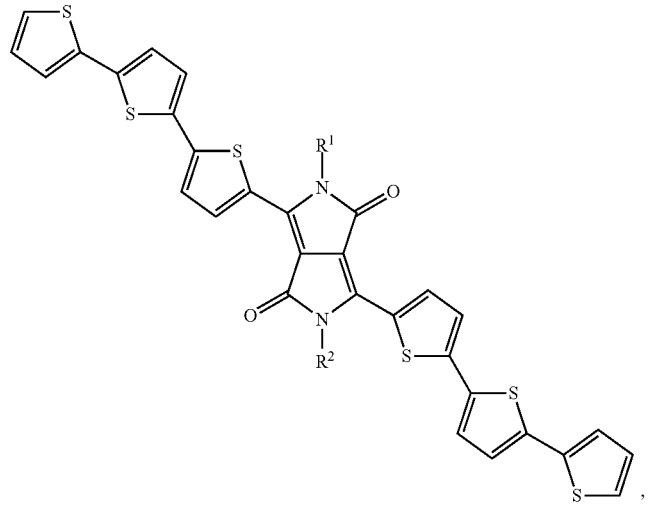
(IIa-1)

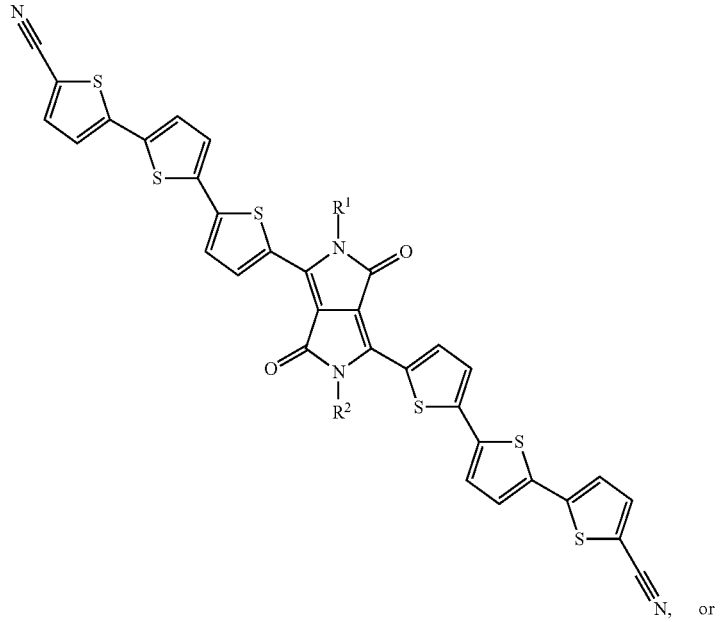
(IIa-2)

or (IIa-3)

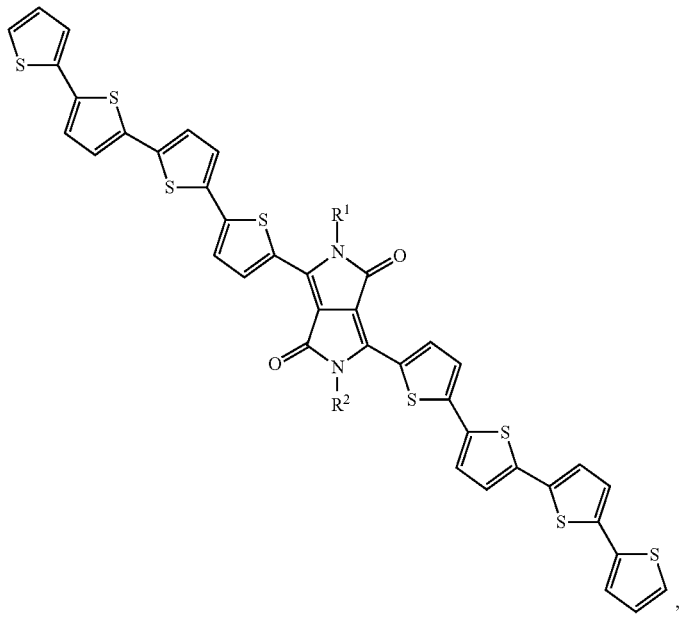

wherein $R^1$ and $R^2$ are the same and are a $C_1$-$C_{38}$alkyl group.

3. The component or the device of claim 1, wherein the compound of formula IIa is present in said OSC material in an amount of 5 to 95% by weight, based on the amount of the polymer of formula Ib and the compound of formula IIa.

4. A process for preparing the device of claim 1, the process comprising:
   (i) mixing one or more the of compound of formula IIa and the polymer of formula Ib, optionally with a solvent or solvent mixture,
   (ii) applying the mixture or the solvent comprising the compound of formula IIa and the polymer of formula Ib to a substrate; and
   optionally evaporating the solvent to form a solid OSC layer.

5. An organic layer, comprising a polymer of a formula Ib and a compound of a formula IIa (Ib)

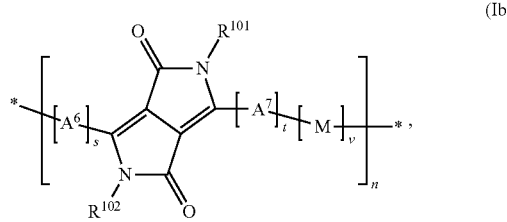

wherein at least one of $A^6$ and $A^7$ is

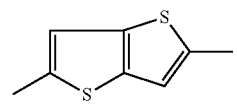

and the other of $A^6$ and $A^7$ is

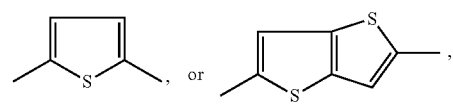

s is an integer 1, or 2; t is an integer 1, or 2;
M is

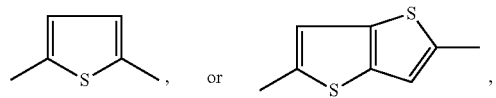

v is an integer 1, 2, or 3;
$R^{101}$ and $R^{102}$ are a $C_1$-$C_{38}$alkyl group and n is 5 to 1000,
wherein the polymer of formula Ib is not a polymer of formula Ib-3:

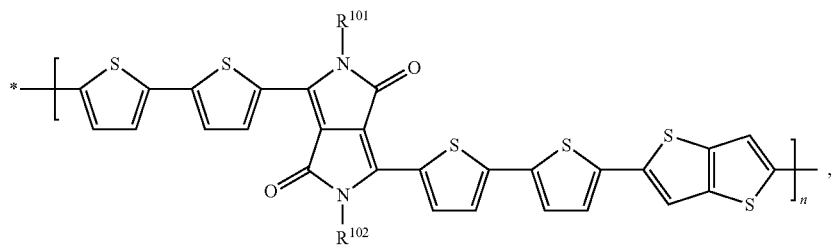

and

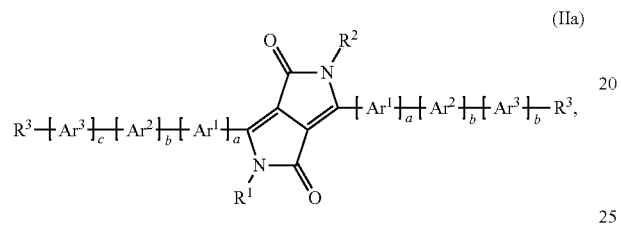

wherein
a is 1, or 2; b is 0, or 1; c is 0, or 1;
$R^1$ and $R^2$ are the same or different and are a $C_1$-$C_{38}$alkyl group,
$Ar^1$, $Ar^2$ and $Ar^3$ are each independently a bivalent group of formula

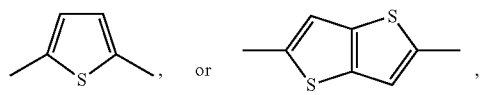

$R^3$ is hydrogen, cyano,

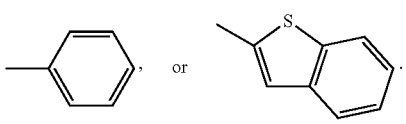

6. A formulation, comprising
(a) a polymer of a formula Ib,

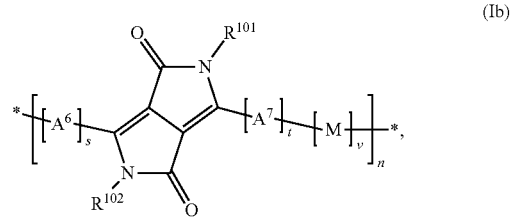

wherein at least one of $A^6$ and $A^7$ is

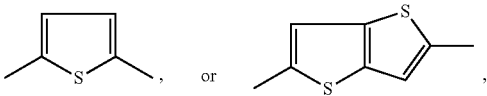

and the other of $A^6$ and $A^7$ is

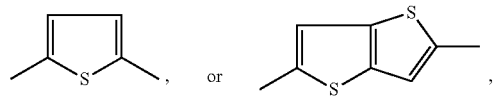

s is an integer 1, or 2; t is an integer 1, or 2;
M is

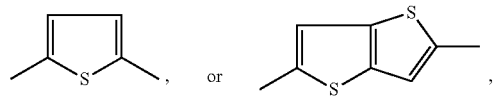

v is an integer 1, 2, or 3;
$R^{101}$ and $R^{102}$ are a $C_1$-$C_{38}$alkyl group and n is 5 to 1000, wherein the polymer of formula Ib is not a polymer of formula Ib-3:

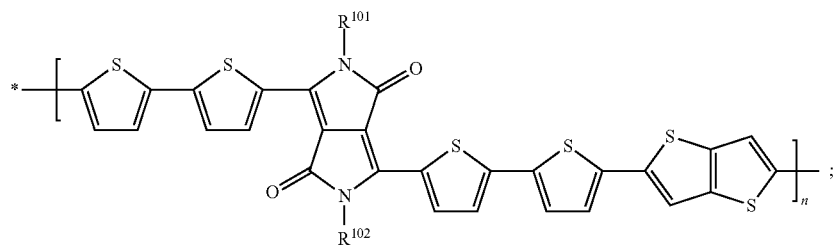

(b) a compound of a formula IIa,

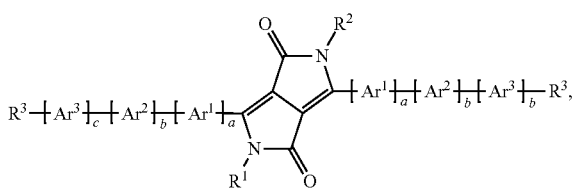
(IIa)

wherein a is 1, or 2; b is 0, or 1; c is 0, or 1;

$R^1$ and $R^2$ are the same or different and are a $C_1$-$C_{38}$alkyl group, $Ar^1$, $Ar^2$ and $Ar^3$ are each independently a bivalent group of formula

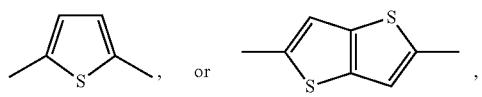

$R^3$ is hydrogen, cyano,

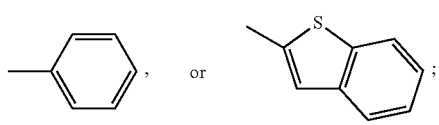

and (c) a solvent, or solvent mixture.

7. An organic semiconductor device comprising the organic layer of claim 5.

8. An organic layer comprising the formulation of claim 6.

9. An apparatus, comprising the component or the device of claim 1.

10. The component or the device of claim 4, wherein the compound of formula IIa is a compound of formula (IIa-1).

11. The organic layer of claim 5, wherein the organic layer is a semiconducting layer.

12. The electronic component or the electronic device of claim 1, wherein the polymer represented by formula (Ib) is a polymer of formula

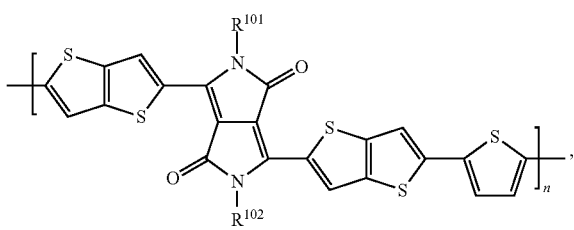
(Ib-7)

and $R^{101}$ and $R^{102}$ are a $C_1$-$C_{38}$alkyl group, and n is 5 to 1000.

13. An electronic component or an electronic device comprising:

a gate electrode;

a source electrode; and a drain electrode;

wherein the component or the device further comprises an organic semiconducting (OSC) material that is provided between the source electrode and the drain electrode, wherein the OSC material comprises (a) a polymer of formula Ib:

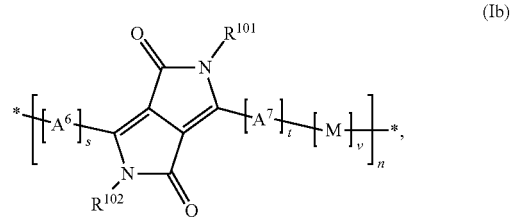
(Ib)

wherein $A^6$ and $A^7$ are each independently

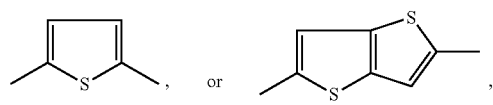

s is an integer 1, or 2; t is an integer 1, or 2;

M is

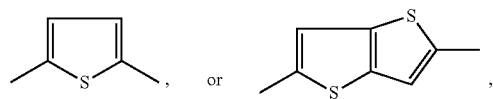

v is an integer 1, 2, or 3;

$R^{101}$ and $R^{102}$ are a $C_1$-$C_{38}$alkyl group and n is 5 to 1000, wherein the polymer of formula Ib is not a polymer of formula Ib-3:

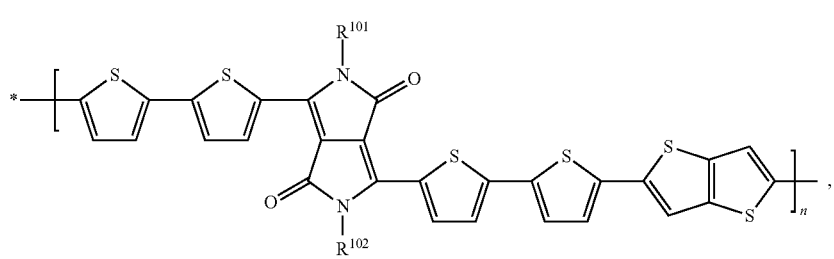

(Ib-3)

and
(b) a compound of formula IIa:

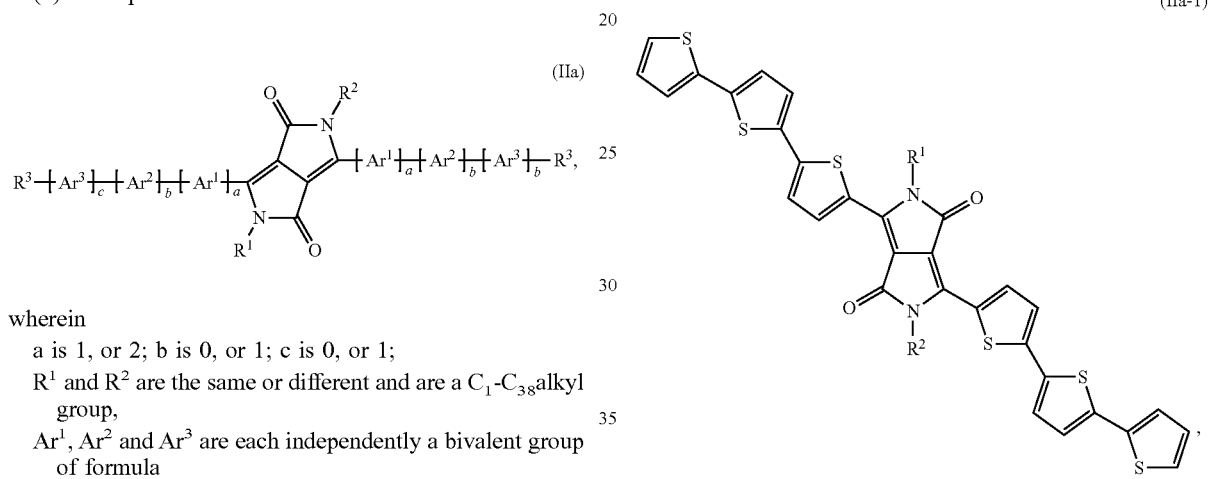

wherein
a is 1, or 2; b is 0, or 1; c is 0, or 1;
$R^1$ and $R^2$ are the same or different and are a $C_1$-$C_{38}$alkyl group,
$Ar^1$, $Ar^2$ and $Ar^3$ are each independently a bivalent group of formula

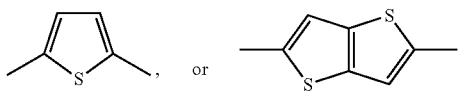

wherein at least one $Ar^1$ is

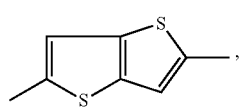

$R^3$ is hydrogen, cyano,

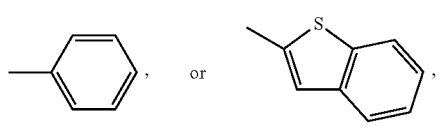

wherein the compound of formula IIa is present in said OSC material in an amount of 0.1 to 99.9% by weight based on the amount of the polymer of formula Ib and the compound of formula IIa.

14. The component or the device of claim 1, wherein the compound of formula IIa is a compound of formula -continued or

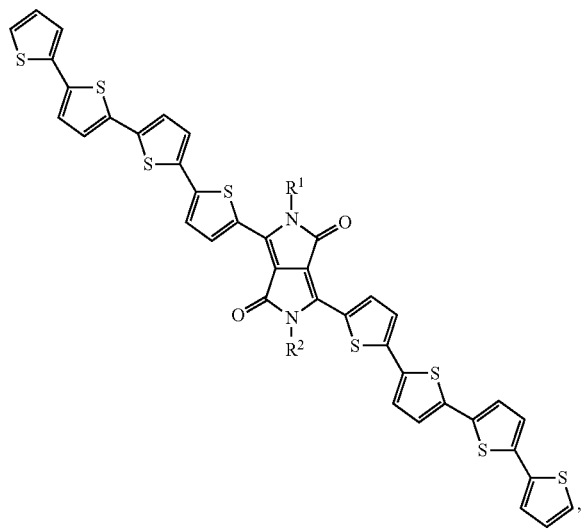
(IIa-3)

wherein R¹ and R² are the same and are a $C_1$-$C_{38}$alkyl group.

15. The component or the device of claim 13, wherein the compound of formula IIa is present in said OSC material in an amount of 5 to 95% by weight, based on the amount of the polymer of formula Ib and the compound of formula IIa.

16. A process for preparing the device of claim 13, the process comprising:
   (i) mixing one or more the of compound of formula IIa and the polymer of formula Ib, optionally with a solvent or solvent mixture,
   (ii) applying the mixture or the solvent comprising the compound of formula IIa and the polymer of formula Ib to a substrate; and
   optionally evaporating the solvent to form a solid OSC layer.

17. An organic layer, comprising a polymer of a formula Ib and a compound of a formula IIa

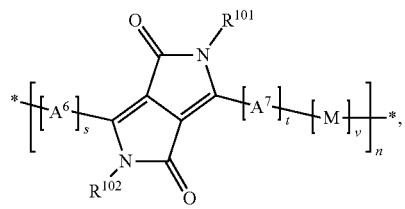
(Ib)

wherein $A^6$ and $A^7$ are each independently

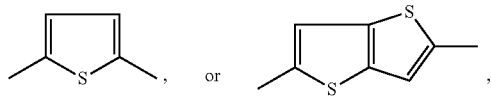

s is an integer 1, or 2; t is an integer 1, or 2;
M is

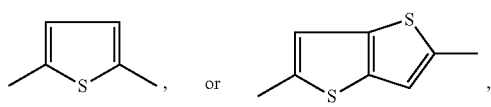

v is an integer 1, 2, or 3;
$R^{101}$ and $R^{102}$ are a $C_1$-$C_{38}$alkyl group and n is 5 to 1000,
wherein the polymer of formula Ib is not a polymer of formula Ib-3:

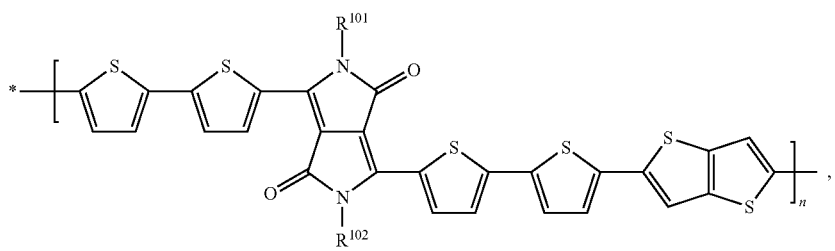
(Ib-3)

and

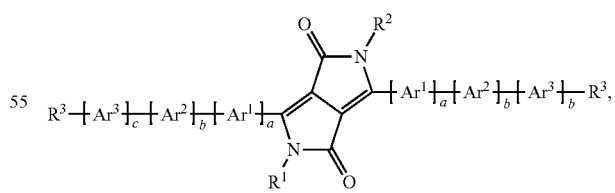
(IIa)

wherein
a is 1, or 2; b is 0, or 1; c is 0, or 1;
$R^1$ and $R^2$ are the same or different and are a $C_1$-$C_{38}$alkyl group,
$Ar^1$, and $Ar^2$ and $Ar^3$ are each independently a bivalent group of formula

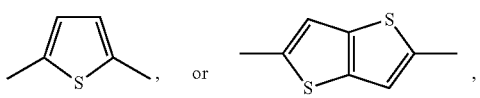, or wherein at least one $Ar^1$ is

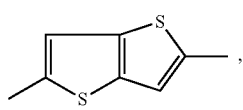, $R^3$ is hydrogen, cyano,

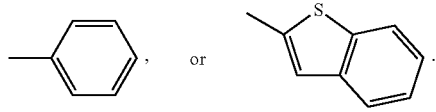.

18. A formulation, comprising
(a) a polymer of a formula Ib,

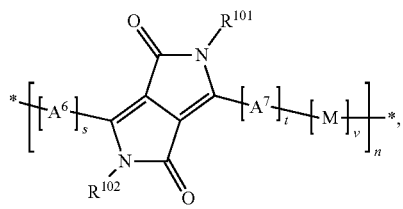

(Ib)

wherein $A^6$ and $A^7$ are each independently

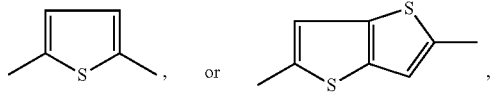, s is an integer 1, or 2; t is an integer 1, or 2;
M is

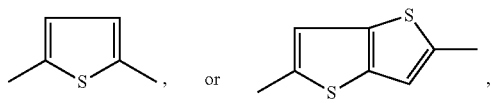, v is an integer 1, 2, or 3;
$R^{101}$ and $R^{102}$ are a $C_1$-$C_{38}$alkyl group and n is 5 to 1000,
wherein the polymer of formula Ib is not a polymer of formula Ib-3:

(b) a compound of a formula IIa,

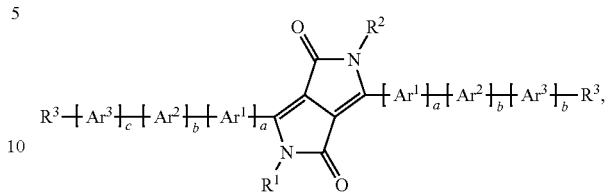

(IIa)

wherein
a is 1, or 2; b is 0, or 1; c is 0, or 1;
$R^1$ and $R^2$ are the same or different and are a $C_1$-$C_{38}$alkyl group,
$Ar^1$, $Ar^2$ and $Ar^3$ are each independently a bivalent group of formula

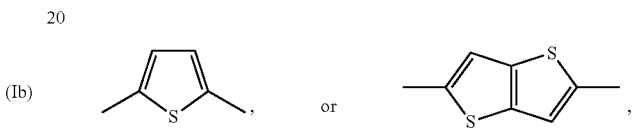, wherein at least one $Ar^1$ is

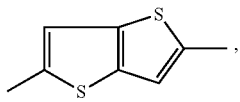, wherein at least one $Ar^1$ is
$R^3$ is hydrogen, cyano,

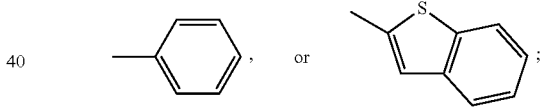;

and
(c) a solvent, or solvent mixture.

19. An organic semiconductor device comprising the organic layer of claim 16.

20. An organic layer comprising the formulation of claim 17.

21. An apparatus, comprising the component or the device of claim 13.

22. The component or the device of claim 14, wherein the compound of formula IIa is a compound of formula (IIa-1).

(Ib-3)

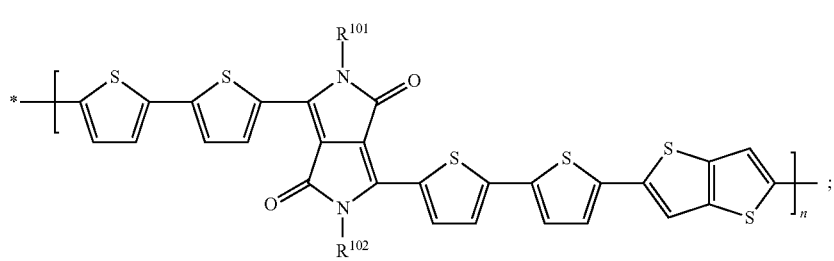

23. The organic layer of claim 16, wherein the organic layer is a semiconducting layer.

24. The electronic component or the electronic device of claim 13, wherein the polymer represented by formula (Ib) is a polymer of formula

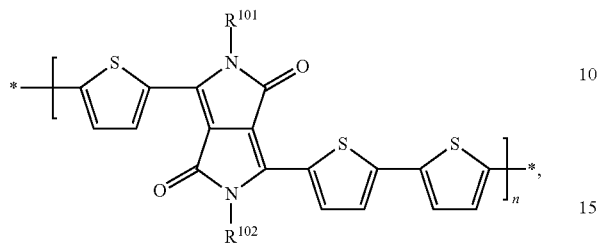

(Ib-1)

and
R$^{101}$ and R$^{102}$ are a C$_1$-C$_{38}$alkyl group, and n is 5 to 1000.

25. The electronic component or the electronic device of claim 13, wherein the polymer represented by formula (Ib) is a polymer of formula

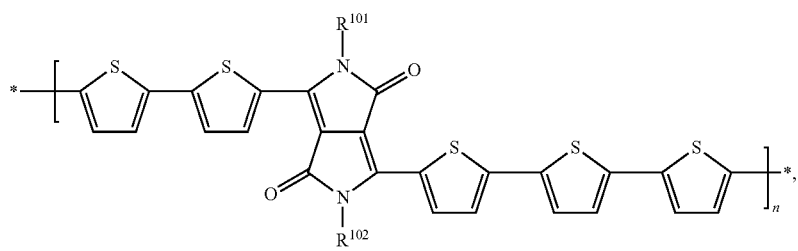

(Ib-2)

and
R$^{101}$ and R$^{102}$ are a C$_1$-C$_{38}$alkyl group, and n is 5 to 1000.

26. The electronic component or the electronic device of claim 13, wherein the polymer represented by formula (Ib) is a polymer of formula (Ib-4)

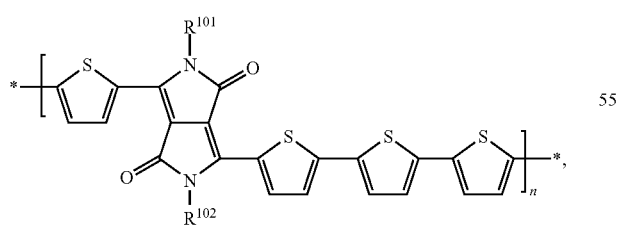

and
R$^{101}$ and R$^{102}$ are a C$_1$-C$_{38}$alkyl group, and n is 5 to 1000.

27. The electronic component or the electronic device of claim 13, wherein the polymer represented by formula (Ib) is a polymer of formula

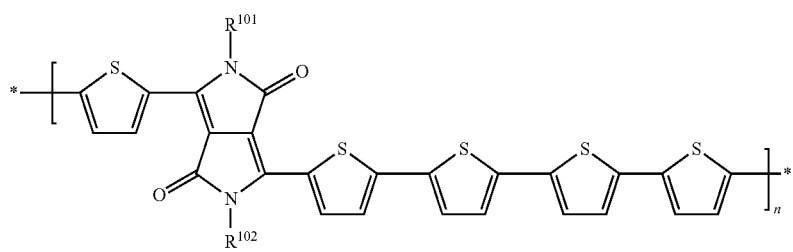

(Ib-5)

and $R^{101}$ and $R^{102}$ are a $C_1$-$C_{38}$alkyl group, and n is 5 to 1000.

28. The electronic component or the electronic device of claim 13, wherein the polymer represented by formula (Ib) is a polymer of formula

29. The electronic component or the electronic device of claim 13, wherein the polymer represented by formula (Ib) is a polymer of formula

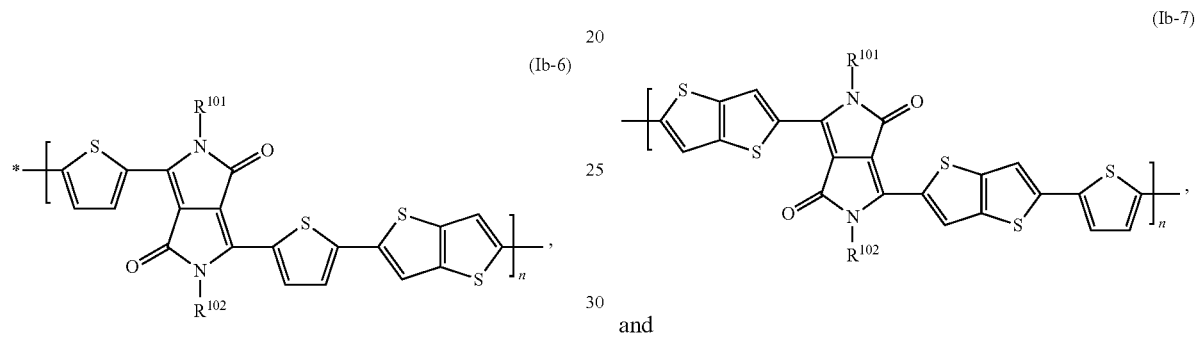

(Ib-6)

(Ib-7)

and $R^{101}$ and $R^{102}$ are a $C_1$-$C_{38}$alkyl group, and n is 5 to 1000.

and $R^{101}$ and $R^{102}$ are a $C_1$-$C_{38}$alkyl group, and n is 5 to 1000.

* * * * *

UNITED STATES PATENT AND TRADEMARK OFFICE
CERTIFICATE OF CORRECTION

PATENT NO. : 9,978,943 B2  
APPLICATION NO. : 14/361129  
DATED : May 22, 2018  
INVENTOR(S) : Patrice Bujard et al.

Page 1 of 2

It is certified that error appears in the above-identified patent and that said Letters Patent is hereby corrected as shown below:

In the Specification

In Column 1, Line 12 (approx.), after "formula" delete "Ia".

In Column 19, Line 36, delete "$C_1$-$C_8$alkyl" insert -- $C_1$-$C_4$alkyl --, therefor;
   Line 66, delete "$C_{2-38}$ alkynyl" insert -- $C_2$-$C_{38}$alkynyl --, therefor.

In Column 23, Lines 37-38, delete "mesithylene," and insert -- mesitylene, --, therefor.

In Column 24, Line 51, delete "crystallity," and insert -- crystallinity, --, therefor.

In Column 26, Line 3, delete "perchlorid" and insert -- perchloride --, therefor;
   Line 4, delete "succinimid" and insert -- succinimide --, therefor.

In Column 28, Line 22, delete "Interdigited" and insert -- Interdigitated --, therefor.

In Column 29, Line 57, delete "then" and insert -- than --, therefor.

In Column 30, Line 2, delete "then" and insert -- than --, therefor;
   Line 5, delete "reproduceability," and insert -- reproducibility, --, therefor.

In the Claims

In Column 30, Lines 31-34, Claim 1, delete " 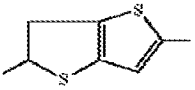 " and insert -- 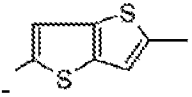 --, therefor;
   Line 37, Claim 1, delete "$A^6$and" and insert -- $A^6$ and --, therefor.

Signed and Sealed this
Thirtieth Day of July, 2019

Andrei Iancu
*Director of the United States Patent and Trademark Office*

CERTIFICATE OF CORRECTION (continued)
U.S. Pat. No. 9,978,943 B2

In Column 32, Lines 1-5, Claim 1, delete " 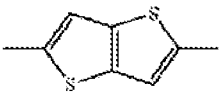 " and insert -- 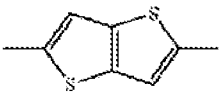 --, therefor.

In Column 33, Line 45, Claim 4, delete "the of" and insert -- of the --, therefor.

In Column 35, Lines 37-43, Claim 5, delete " 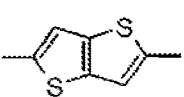 " and insert -- 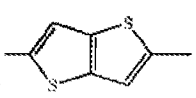 --, therefor.

In Column 37, Lines 22-25, Claim 6, delete " 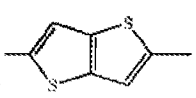 " and insert -- 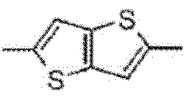 --, therefor.

In Column 39, Lines 39-44, Claim 13, delete "  " and insert --  --, therefor.

In Column 41, Line 56, Claim 16, delete "the of" and insert -- of the --, therefor.

In Column 42, Line 66, Claim 17, after "Ar$^1$," delete "and".

In Column 43, Lines 1-4, Claim 17, delete " 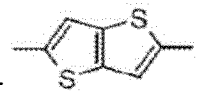 " and insert -- 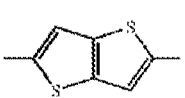 --, therefor.

In Column 44, Line 34, Claim 18, after " 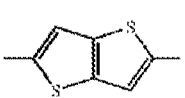 " delete "wherein at least one Ar$^1$ is".